(12) United States Patent
Hwang et al.

(10) Patent No.: US 11,688,331 B2
(45) Date of Patent: Jun. 27, 2023

(54) DISPLAY DEVICE

(71) Applicant: Samsung Display Co., LTD., Yongin-si (KR)

(72) Inventors: Jung Hwan Hwang, Seongnam-si (KR); Hyun Joon Kim, Hwaseong-si (KR); Kye Uk Lee, Seoul (KR); Sang Jin Jeon, Hwaseong-si (KR); Jun Ki Jeong, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/849,299

(22) Filed: Jun. 24, 2022

(65) Prior Publication Data
US 2023/0124542 A1 Apr. 20, 2023

(30) Foreign Application Priority Data
Oct. 14, 2021 (KR) ........................ 10-2021-0136760

(51) Int. Cl.
*G09G 3/22* (2006.01)
*G09G 3/3208* (2016.01)
*G09G 3/3241* (2016.01)
*G09G 3/3233* (2016.01)
*G09G 3/36* (2006.01)

(52) U.S. Cl.
CPC ............ *G09G 3/22* (2013.01); *G09G 3/3208* (2013.01); *G09G 3/3233* (2013.01); *G09G 3/3241* (2013.01); *G09G 3/3648* (2013.01); *G09G 2330/025* (2013.01); *G09G 2330/028* (2013.01)

(58) Field of Classification Search
CPC ...... G09G 3/22; G09G 3/3208; G09G 3/3233; G09G 3/3241; G09G 3/3648; G09G 2330/025; G09G 2330/028
See application file for complete search history.

(56) References Cited

U.S. PATENT DOCUMENTS

| | | | |
|---|---|---|---|
| 2009/0021536 A1* | 1/2009 | Abe | G09G 3/325 345/77 |
| 2009/0167649 A1* | 7/2009 | Ishizuka | G09G 3/3258 345/80 |

(Continued)

FOREIGN PATENT DOCUMENTS

| | | |
|---|---|---|
| KR | 10-2020-0038735 A | 4/2020 |
| KR | 10-2020-0038741 A | 4/2020 |

*Primary Examiner* — Mihir K Rayan
(74) *Attorney, Agent, or Firm* — Lewis Roca Rothgerber Christie LLP

(57) ABSTRACT

A display device includes: a first pixel driver to generate a control current; a second pixel driver to generate a driving current, and control a period during which the driving current flows, based on the control current; and a light-emitting element connected to the second pixel driver to receive the driving current. The first pixel driver includes: a first transistor to generate the control current based on a first data voltage; and a second transistor to provide the first data voltage to a first electrode of the first transistor based on a scan write signal from a scan write line. The second pixel driver includes: a third transistor to generate the driving current based on the control current; and a fourth transistor to provide a second data voltage to a first electrode of the third transistor based on a scan write signal from the scan write line.

20 Claims, 21 Drawing Sheets

(56) References Cited

U.S. PATENT DOCUMENTS

| | | | | |
|---|---|---|---|---|
| 2018/0301080 A1* | 10/2018 | Shigeta | ............... | G09G 3/32 |
| 2020/0111403 A1* | 4/2020 | Kim | ............... | G09G 3/32 |
| 2020/0312229 A1* | 10/2020 | Kim | ............... | G09G 3/32 |
| 2020/0365078 A1* | 11/2020 | Zhai | ............... | G09G 3/3233 |
| 2020/0394953 A1* | 12/2020 | Kim | ............... | H05B 45/325 |
| 2020/0403059 A1 | 12/2020 | Oh et al. | | |
| 2021/0110771 A1 | 4/2021 | Lee et al. | | |
| 2021/0210003 A1 | 7/2021 | Kim et al. | | |
| 2022/0101783 A1* | 3/2022 | Han | ............... | G09G 3/32 |

* cited by examiner

DISPLAY DEVICE

CROSS-REFERENCE TO RELATED APPLICATION

This application claims priority to and the benefit of Korean Patent Application No. 10-2021-0136760, filed on Oct. 14, 2021, the entire disclosure of which is incorporated by reference herein.

BACKGROUND

1. Field

Aspects of embodiments of the present disclosure relate to a display device.

2. Description of the Related Art

As information society has developed, the demand for display devices for displaying images has diversified. Examples of such display devices include flat panel display devices, such as a liquid crystal display (LCD) device, a field emission display (FED) device, and an organic light-emitting diode (OLED) display device.

Examples of light-emitting display devices include an OLED display device including organic light emitting diodes (OLEDs), and an inorganic light-emitting diode (LED) display device including inorganic light-emitting diodes (LEDs). The OLED display device may control the luminance or grayscale of light emitted from the OLEDs by controlling a magnitude of a driving current applied to the OLEDs. On the other hand, the wavelength of light emitted from inorganic LEDs varies depending on a driving current applied to the inorganic LEDs, such that the quality of an image may deteriorate if the inorganic LEDs are driven in the same manner as that of the OLEDs.

The above information disclosed in this Background section is for enhancement of understanding of the background of the present disclosure, and therefore, it may contain information that does not constitute prior art.

SUMMARY

Embodiments of the present disclosure are directed to a display device capable of minimizing or reducing luminance deviations, and improving the quality of an image by controlling a driving current applied to an inorganic light-emitting diode (LED).

However, the present disclosure is not limited to the aspects and features set forth above. The above and other aspects and features of the present disclosure will become more apparent to those having ordinary skill in the art to which the present disclosure pertains by referring to the detailed description below with reference to the figures.

According to one or more embodiments of the present disclosure, a display device includes: a first pixel driver connected to a scan write line, a sweep line, and a first data line, the first pixel driver being configured to generate a control current based on a first data voltage received from the first data line; a second pixel driver connected to the scan write line and a second data line, the second pixel driver being configured to generate a driving current based on a second data voltage received from the second data line, and control a period during which the driving current flows, based on the control current; and a light-emitting element connected to the second pixel driver to receive the driving current. The first pixel driver includes: a first transistor to generate the control current based on the first data voltage; a second transistor to provide the first data voltage to a first electrode of the first transistor based on a scan write signal received from the scan write line; and a first capacitor including a first capacitor electrode connected to a gate electrode of the first transistor, and a second capacitor electrode connected to the sweep line. The second pixel driver includes: a third transistor to generate the driving current based on the control current; a fourth transistor to provide the second data voltage to a first electrode of the third transistor based on a scan write signal received from the scan write line; and a second capacitor including a first capacitor electrode connected to a gate electrode of the third transistor, and a second capacitor electrode to receive the control current.

In an embodiment, a sweep signal of the sweep line may have a pulse that linearly decreases from a gate-off voltage to a gate-on voltage.

In an embodiment, the display device may further include a scan initialization line and an initialization voltage line connected to the first pixel driver, and the first pixel driver may further include: a fifth transistor to electrically connect a second electrode of the first transistor and the gate electrode of the first transistor to each other based on the scan write signal; and a sixth transistor to electrically connect the gate electrode of the first transistor and the initialization voltage line to each other based on a scan initialization signal received from the scan initialization line.

In an embodiment, the fifth transistor may include a plurality of transistors connected in series between the second electrode of the first transistor and the gate electrode of the first transistor.

In an embodiment, the sixth transistor may include a plurality of transistors connected in series between the gate electrode of the first transistor and the initialization voltage line.

In an embodiment, the display device may further include a pulse width modulation (PWM) emission line and a first power supply line connected to the first pixel driver, and the first pixel driver may include: a seventh transistor to electrically connect the first power supply line and the first electrode of the first transistor to each other based on a PWM emission signal received from the PWM emission line; and an eighth transistor to electrically connect the second electrode of the first transistor and the second capacitor electrode of the second capacitor to each other based on the PWM emission signal.

In an embodiment, the display device may further include a scan control line and a gate-off voltage line connected to the first pixel driver, and the first pixel driver may further include a ninth transistor to electrically connect the gate-off voltage line and the second capacitor electrode of the first capacitor to each other based on a scan control signal received from the scan control line.

In an embodiment, the first pixel driver may further include a tenth transistor to electrically connect the second capacitor electrode of the second capacitor and the initialization voltage line to each other based on the scan control signal.

In an embodiment, the display device may further include a scan initialization line and an initialization voltage line connected to the second pixel driver, and the second pixel driver may further include: an eleventh transistor to electrically connect a second electrode of the third transistor and the gate electrode of the third transistor to each other based on the scan write signal; and a twelfth transistor to electrically connect the gate electrode of the third transistor and the initialization voltage line to each other based on a scan initialization signal received from the scan initialization line.

In an embodiment, the display device may further include a tenth transistor including a plurality of transistors connected in series between the second electrode of the third transistor and the gate electrode of the third transistor.

In an embodiment, the eleventh transistor may include a plurality of transistors connected in series between the gate electrode of the third transistor and the initialization voltage line.

In an embodiment, the display device may further include a PWM emission line, a pulse amplitude modulation (PAM) emission line, and a second power supply line connected to the second pixel driver, and the second pixel driver may further include: a thirteenth transistor to electrically connect the second power supply line and the first electrode of the third transistor to each other based on a PWM emission signal received from the PWM emission line; and a fourteenth transistor to electrically connect the second electrode of the third transistor and a first electrode of the light-emitting element to each other based on a PAM emission signal received from the PAM emission line.

In an embodiment, the second pixel driver may further include a fifteenth transistor to electrically connect the first electrode of the light-emitting element and the initialization voltage line to each other based on the scan initialization signal.

According to one or more embodiments of the present disclosure, a display device includes: a first pixel driver connected to a scan initialization line, a scan write line, a scan control line, a sweep line, an initialization voltage line, a gate-off voltage line, and a first data line, the first pixel driver being configured to generate a control current based on a first data voltage received from the first data line; a second pixel driver connected to the scan write line and a second data line, the second pixel driver being configured to generate a driving current based on a second data voltage received from the second data line, and control a period during which the driving current flows, based on the control current; and a light-emitting element connected to the second pixel driver to receive the driving current. The first pixel driver includes: a first transistor to generate the control current based on the first data voltage; a second transistor to provide the first data voltage to a first electrode of the first transistor based on a scan write signal received from the scan write line; a third transistor to electrically connect a gate electrode of the first transistor and the initialization voltage line to each other based on a scan initialization signal received from the scan initialization line; a first capacitor including a first capacitor electrode connected to the gate electrode of the first transistor, and a second capacitor electrode connected to the sweep line; and a fourth transistor to electrically connect the gate-off voltage line and the second capacitor electrode of the first capacitor to each other based on a scan control signal received from the scan control line. The scan initialization signal and the scan write signal are generated one time in one frame, and the scan control signal is generated as many times in the one frame as that of a number of emission periods in the one frame.

In an embodiment, the second pixel driver may include: a fifth transistor to generate the driving current based on the control current; and a sixth transistor to provide the second data voltage to a first electrode of the fifth transistor based on a scan write signal received from the scan write line.

In an embodiment, the second pixel driver may further include a second capacitor including a first capacitor electrode connected to a gate electrode of the fifth transistor, and a second capacitor electrode to receive the control current.

In an embodiment, a sweep signal of the sweep line may have a pulse that linearly decreases from a gate-off voltage to a gate-on voltage during each of the emission periods of the one frame.

According to one or more embodiments of the present disclosure, a display device includes: a substrate; an active layer including a first channel, a first source electrode, and a first drain electrode on the substrate; a first capacitor electrode on the active layer, the first capacitor electrode overlapping with the first channel; a second capacitor electrode on the first capacitor electrode, the second capacitor electrode overlapping with the first capacitor electrode; a sweep line on the second capacitor electrode to provide a sweep signal; a second source electrode connected to the first drain electrode; a second channel adjacent to the second source electrode; a second drain electrode adjacent to the second channel; a connecting electrode at the same layer as that of the sweep line, and connected to the second drain electrode; a third capacitor electrode at the same layer as that of the first capacitor electrode; and a fourth capacitor electrode at the same layer as that of the second capacitor electrode, and connected to the connecting electrode.

In an embodiment, the display device may further include: a third drain electrode connected to the first source electrode; a third channel adjacent to the third drain electrode; a third source electrode adjacent to the third channel; and a first data line on the sweep line, and electrically connected to the third source electrode to provide a first data voltage.

In an embodiment, the display device may further include: a fourth channel overlapping with the third capacitor electrode; a fourth source electrode on one side of the fourth channel; a fourth drain electrode on another side of the fourth channel; a fifth drain electrode connected to the fourth source electrode; a fifth channel adjacent to the fifth drain electrode; a fifth source electrode adjacent to the fifth channel; and a second data line at the same layer as that of the first data line, and electrically connected to the fifth source electrode to provide a second data voltage.

According to one or more embodiments of the present disclosure, as a control current is applied to capacitors connected to the gate electrodes of transistors having an amplitude distribution, a duty distribution and the amplitude distribution may both be prevented or substantially prevented from being caused in one transistor, and luminance deviations may be minimized or reduced by improving a margin for the threshold voltage distribution of the transistors.

However, the present disclosure is not limited to the aspects and features above, and other aspects and features of the present disclosure may be more apparent from the following detailed description with reference to the drawings, and the claims and their equivalents.

BRIEF DESCRIPTION OF THE DRAWINGS

The above and other aspects and features of the present disclosure will be more clearly understood from the following detailed description of the illustrative, non-limiting embodiments with reference to the accompanying drawings, in which.

DETAILED DESCRIPTION

Figure 1:
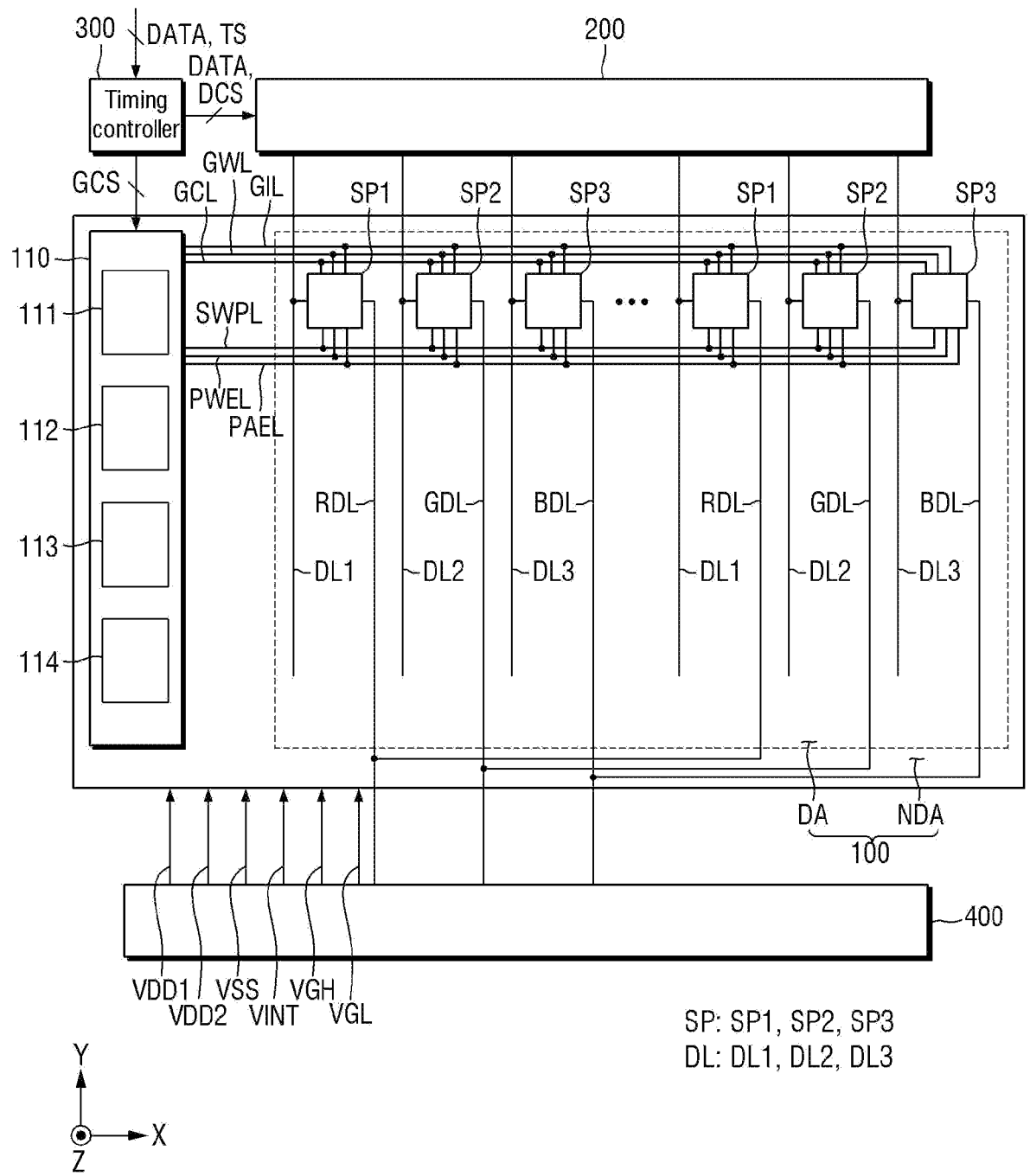
FIG. 1 is a block diagram of a display device according to an embodiment of the present disclosure.

Hereinafter, embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, redundant description thereof may not be repeated.

When a certain embodiment may be implemented differently, a specific process order may be different from the described order. For example, two consecutively described processes may be performed at the same or substantially at the same time, or may be performed in an order opposite to the described order.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected.

Thus, embodiments disclosed herein should not necessarily be construed as limited to the particular illustrated shapes of regions, but are to include deviations and variations in shapes that result from, for example, manufacturing processes. In this manner, regions illustrated in the drawings may be schematic in nature, and the shapes of these regions may not reflect the actual shapes of the regions of a device, and thus, are not necessarily intended to be limiting.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, and the like of the elements, unless otherwise specified.

In the figures, the x-axis, the y-axis, and the z-axis are not limited to three axes of the rectangular coordinate system, and may be interpreted in a broader sense. For example, the x-axis, the y-axis, and the z-axis may be perpendicular to or substantially perpendicular to one another, or may represent different directions from each other that are not perpendicular to one another.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. To this end, the terms "connected to" and "coupled to" may refer to a physical, electrical, and/or fluid connection, with or without intervening elements. Similarly, when a layer, an area, or an element is referred to as being "electrically connected" to another layer, area, or element, it may be directly electrically connected to the other layer, area, or element, and/or may be indirectly electrically connected with one or more intervening layers, areas, or elements therebetween. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, the expression "A and/or B" denotes A, B, or A and B. Expressions such as "at least one of," when preceding a list of elements, modify the entire list of elements and do not modify the individual elements of the list. For example, the expression "at least one of a, b, or c," "at least one of a, b, and c," and "at least one selected from the group consisting of a, b, and c" indicates only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

As customary in the field, some embodiments are described and illustrated in the accompanying drawings in terms of functional blocks, units, parts, and/or modules. Those skilled in the art will appreciate that these blocks, units, parts, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, parts, and/or modules being implemented by microprocessors or other similar hardware, they may be programmed and controlled using software (e.g., microcode) to perform various functions discussed herein, and may optionally be driven by firmware and/or software. It is also contemplated that each block, unit, part, and/or module may be implemented by dedicated hardware, or as a combination of dedicated hardware to perform some functions, and a processor (e.g., one or more programmed microprocessors and associated circuitry) to perform other functions. Also, each block, unit, part, and/or module of some embodiments may be physically separated into two or more interacting and discrete blocks, units, parts, and/or modules, all without departing from the scope of the present disclosure. Further, the blocks, units, parts, and/or modules of some embodiments may be physically combined into more complex blocks, units, parts, and/or modules, all without departing from the scope of the present disclosure.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a block diagram of a display device according to an embodiment of the present disclosure.

Referring to FIG. 1, the display device may include a display panel 100, a gate driver 110, a data driver 200, a timing controller 300, and a power supply 400.

A display area DA of the display panel 100 may include pixels SP, a scan initialization line GIL, a scan write line GWL, a scan control line GCL, a sweep line SWPL, a pulse width modulation (PWM) emission line PWEL, a pulse amplitude modulation (PAM) emission line PAEL, data lines DL, first PAM data lines RDL, second PAM data lines GDL, and third PAM data lines BDL.

The scan initialization line GIL, the scan write line GWL, the scan control line GCL, the sweep line SWPL, the PWM Emission line PWEL, and the PAM emission line PAEL may extend in a first direction (e.g., an X-axis direction), and may be spaced apart from one another in a second direction (e.g., a Y-axis direction). The data lines DL, the first PAM data lines RDL, the second PAM data lines GDL, and the third PAM data lines BDL may extend in the second direction (e.g., the Y-axis direction), and may be spaced apart from one another in the first direction (e.g., the X-axis direction). The first PAM data lines RDL may be electrically connected to each other, the second PAM data lines GDL may be electrically connected to each other, and the third PAM data lines BDL may be electrically connected to each other.

The pixels SP may include first pixels SP1 that emit first light, second pixels SP2 that emit second light, and third pixels SP3 that emit third light. The first light, the second light, and the third light may correspond to light of a red wavelength range, light of a green wavelength range, and light of a blue wavelength range, respectively, but the present disclosure is not limited thereto. For example, the first light may have a peak wavelength of about 600 nm to about 750 nm, the second light may have a peak wavelength of about 480 nm to about 560 nm, and the third light may have a peak wavelength of about 370 nm to about 460 nm.

The first pixels SP1, the second pixels SP2, and the third pixels SP3 may be connected to the scan initialization line GIL, the scan write line GWL, the scan control line GCL, the sweep line SWPL, the PWM emission line PWEL, and the PAM emission line PAEL. The first pixels SP1 may also be connected to first data lines DL1 and the first PAM data lines RDL. The second pixels SP2 may also be connected to second data lines DL2 and the second PAM data lines GDL. The third pixels SP3 may also be connected to third data lines DL3 and the third PAM data lines BDL.

A non-display area NDA of the display panel 100 may include the gate driver 110, which provides signals to the scan initialization line GIL, the scan write line GWL, the scan control line GCL, the sweep line SWPL, the PWM emission line PWEL, and the PAM emission line PAEL. For example, the gate driver 110 may be disposed along one edge or two edges (e.g., two opposite edges) of the non-display area NDA. In another example, the gate driver 110 may be disposed at (e.g., in or on) the display area DA.

The gate driver 110 may receive a gate control signal GCS from the timing controller 300. The gate control signal GCS may include first and second scan driving control signals, a sweep control signal, and first and second emission control signals.

The gate driver 110 may include a first scan signal output unit (e.g., a first scan signal output circuit) 111, a second scan signal output unit (e.g., a second scan signal output circuit) 112, a sweep signal output unit (e.g., a sweep signal output circuit) 113, and an emission signal output unit (e.g., an emission signal output circuit) 114.

The first scan signal output unit 111 may receive a first scan driving control signal from the timing controller 300. The first scan signal output unit 111 may provide a scan initialization signal to the scan initialization line GIL based on the first scan driving control signal, and may provide a scan write signal to the scan write line GWL. Thus, the first scan signal output unit 111 may output both the scan initialization signal and the scan write signal together.

The second scan signal output unit 112 may receive a second scan driving control signal from the timing controller 300. The second scan signal output unit 112 may output a scan control signal to the scan control line GCL based on the second scan driving control signal.

The sweep signal output unit 113 may receive a sweep control signal from the timing controller 300. The sweep signal output unit 113 may provide a sweep signal to the sweep line SWPL based on the sweep control signal.

The emission signal output unit 114 may receive first and second emission control signals from the timing controller 300. The emission signal output unit 114 may supply a PWM emission signal to the PWM emission line PWEL based on the first emission control signal, and may provide a PAM emission signal to the PAM emission line PAEL based on the second emission control signal.

The data driver 200 may receive digital video data DAT and a data control signal DCS from the timing controller 300. The data driver 200 may convert the digital video data DATA into analog data voltages, and may supply the analog data voltages to the data lines DL. The first pixels SP1, the second pixels SP2, and the third pixels SP3 may each be selected by a scan write signal from the gate driver 110, and then may receive a data voltage.

The timing controller 300 may receive the digital video data DATA and timing signals TS. The timing controller 300 may generate the gate control signal GCS based on the timing signals TS, and thus, may control the operation timing of the gate driver 110. The timing controller 300 may generate the data control signal DCS, and may control the operation timing of the data driver 200. The timing controller 300 may provide the digital video data DATA to the data driver 200.

The power supply 400 may commonly supply a first PAM data voltage to the first PAM data lines RDL, may commonly supply a second PAM data voltage to the second PAM data lines GDL, and may commonly supply a third PAM data voltage to the third PAM data lines BDL. The power supply 400 may generate a plurality of power supply voltages, and may provide the power supply voltages to the display panel 100.

The power supply 400 may provide a first power supply voltage VDD1, a second power supply voltage VDD2, a third power supply voltage VSS, an initialization voltage VINT, a gate-on voltage VGL, and a gate-off voltage VGH to the display panel 100. The first and second power supply voltages VDD1 and VDD2 may be high-potential voltages for driving light-emitting elements of the pixels SP. The third power supply voltage VSS may be a low-potential voltage for driving the light-emitting elements of the pixels SP. The initialization voltage VINT and the gate-off voltage VGH may be applied to each of the pixels SP, and the gate-on voltage VGL and the gate-off voltage VGH may be applied to the gate driver 110.

Figure 2:
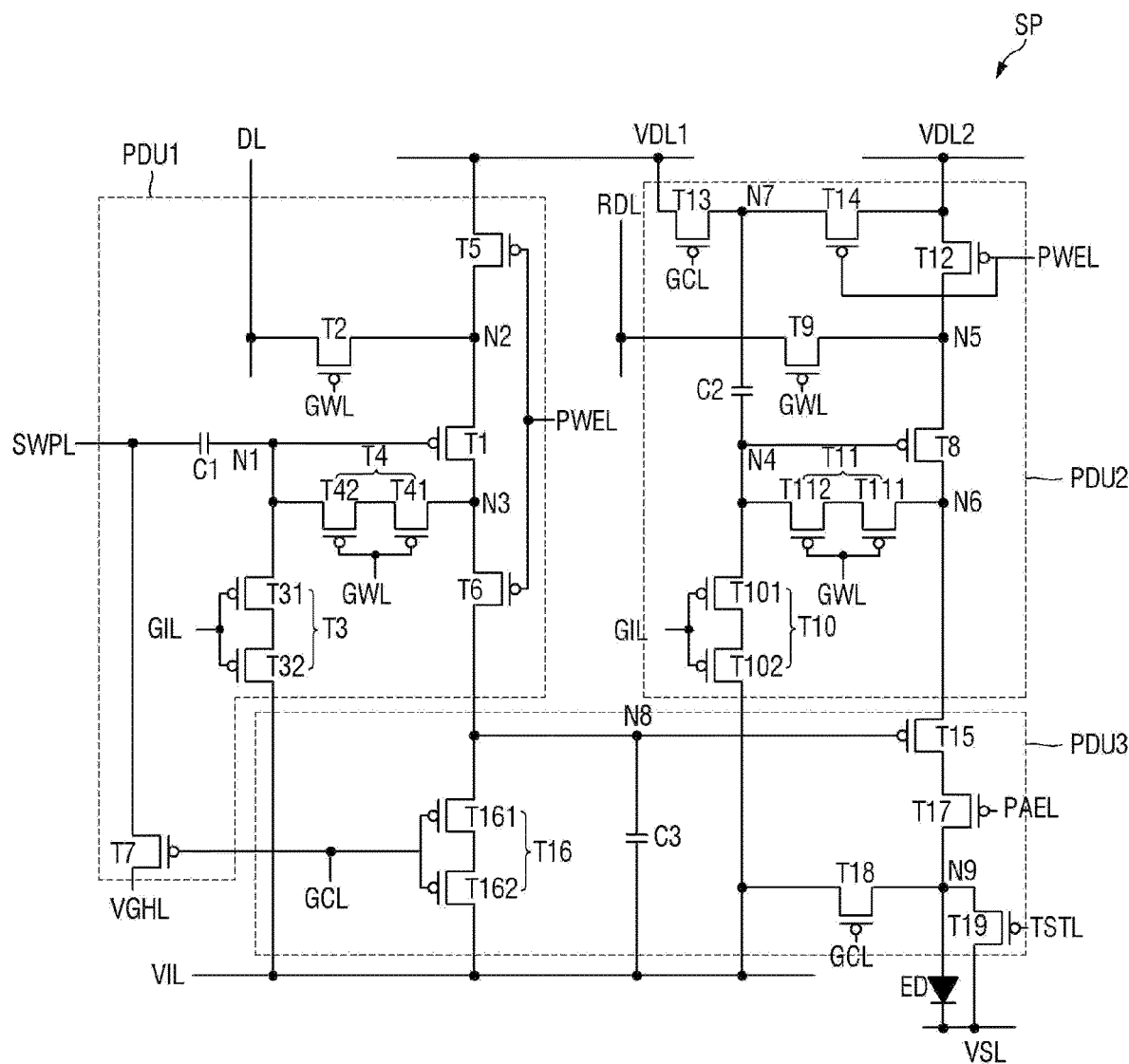
FIG. 2 is a circuit diagram of a pixel of the display device of FIG. 1.

FIG. 2 is a circuit diagram of a pixel of the display device of FIG. 1.

Referring to FIG. 2, a pixel SP may include a first pixel driver PDU1, a second pixel driver PDU2, a third pixel driver PDU3, and a light-emitting element ED. The first pixel driver PDU1 may include first through seventh transistors T1 through T7, and a first capacitor C1.

The first transistor T1 may control a control current, which is provided to an eighth node N8 of the third pixel driver PDU3, based on a voltage of a first node N1, which is connected to the gate electrode of the first transistor T1. The second transistor T2 may be turned on by a scan write signal from a scan write line GWL to provide a data voltage from a data line DL to a second node N2, which is connected to the first electrode of the first transistor T1. The third transistor T3 may be turned on based on a scan initialization signal from a scan initialization line GIL to discharge the first node N1 to the initialization voltage VINT of an initialization voltage line VIL. For example, the third transistor T3 may include a (3-1)-th transistor T31 and a (3-2)-th transistor T32, which are connected in series. The fourth transistor T4 may be turned on based on the scan write signal from the scan write line GWL to electrically connect the first node N1 and a third node N3, which is connected to the second electrode of the first transistor T1, to each other. In other words, when the fourth transistor T4 is turned on, the first transistor T1 may be diode-connected. For example, the fourth transistor T4 may include a (4-1)-th transistor T41 and a (4-2)-th transistor T42, which are connected in series.

The fifth transistor T5 may be turned on based on a PWM emission signal from a PWM emission line PWEL to electrically connect a first power supply line VDL1 and the second node N2 to each other. The sixth transistor T6 may be turned on based on the PWM emission signal from the PWM emission line PWEL to electrically connect the third node N3 and the eighth node N8 of the third pixel driver PDU3 to each other. The seventh transistor T7 may be turned on based on a scan control signal from a scan control line GCL to supply the gate-off voltage VGH to a second capacitor electrode of the first capacitor C1, which is connected to the sweep line SWPL. The first capacitor C1 may be connected between the first node N1 and the sweep line SWPL.

The second pixel driver PDU2 may include eighth through fourteenth transistors T8 through T14, and a second capacitor C2.

The eighth transistor T8 may control a driving current to flow in the light-emitting element ED based on a voltage of a fourth node N4, which is connected to the gate electrode of the eighth transistor T8. The ninth transistor T9 may be turned on based on the scan write signal from the scan write line GWL to supply a first PAM data voltage from a first PAM data line RDL to a fifth node N5, which is connected to the first electrode of the eighth transistor T8. The tenth transistor T10 may be turned on based on the scan initialization signal from the scan initialization line GIL to discharge the fourth node N4 to the initialization voltage VINT. For example, the tenth transistor T10 may include a (10-1)-th transistor T101 and a (10-2)-th transistor T102, which are connected in series. The eleventh transistor T11 may be turned on based on the scan write signal from the scan write line GWL to electrically connect the fourth node N4 and a sixth node N6, which is connected to the second electrode of the eighth transistor T8, to each other. For example, the eleventh transistor T11 may include a (11-1)-th transistor T111 and a (11-2)-th transistor T112, which are connected in series.

The twelfth transistor T12 may be turned on based on the PWM emission signal from the PWM emission line PWEL to electrically connect a second power supply line VDL2 and the fifth node N5 to each other. The thirteenth transistor T13 may be turned on based on the scan control signal from the scan control line GCL to electrically connect the first power supply line VDL1 and a seventh node N7, which is connected to a second capacitor electrode of the second capacitor C2, to each other. The fourteenth transistor T14 may be turned on based on the PWM emission signal from the PWM emission line PWEL to electrically connect the second power supply line VDL2 and the seventh node N7 to each other. The second capacitor C2 may be connected between the fourth node N4 and the seventh node N7.

The third pixel driver PDU3 may include fifteenth through nineteenth transistors T15 through T19, and a third capacitor C3.

The fifteenth transistor T15 may control a period for which the driving current flows, based on a control current received at the eighth node N8, which is connected to the gate electrode of the fifteenth transistor T15. The sixteenth transistor T16 may be turned on based on the scan control signal from the scan control line GCL to discharge the eighth node N8 to the initialization voltage VINT. For example, the sixteenth transistor T16 may include a (16-1)-th T161 and a (16-2)-th transistor T162, which are connected in series. The seventeenth transistor T17 may be turned on based on the PAM emission signal from the PAM emission line PAEL to electrically connect the second electrode of the fifteenth transistor T15 and a ninth node N9, which is connected to the first electrode of the light-emitting element ED, to each other. The eighteenth transistor T18 may be turned on based on the scan control signal from the scan control line GCL to discharge the ninth node N9 to a voltage as low as the initialization voltage VINT. The nineteenth transistor T19 may be turned on based on a test signal from a test signal line TSTL to electrically connect the ninth node N9 and a third power supply line VSL to each other. The third capacitor C3 may be connected between the eighth node N8 and the initialization voltage line VIL.

The light-emitting element ED may be connected between the ninth node N9 and the third power supply line VSL.

For example, one of the first and second electrodes of each of the first through nineteenth transistors T1 through T19 may be a source electrode, and the other electrode of each of the first through nineteenth transistors T1 through T19 may be a drain electrode. The first through nineteenth transistors T1 through T19 may be implemented as P-type metal-oxide semiconductor field-effect transistors (MOSFETs), but the present disclosure is not limited thereto. As another example, the first through nineteenth transistors T1 through T19 may be implemented as N-type MOSFETs.

The pixel SP may correspond to one of the first pixels SP1 connected to the first PAM data lines RDL, and thus, each of the first pixels SP1 may have the same or substantially the same circuit structure as that of the pixel SP shown in FIG. 2. The second pixels SP2 and the third pixels SP3 may each have the same or substantially the same circuit structure as that of the pixel SP shown in FIG. 2, except that the second pixels SP2 and the third pixels SP3 are connected to the second PAM data lines GDL and the third PAM data lines BDL, respectively, and thus, redundant description thereof will not be repeated.

Figure 3:
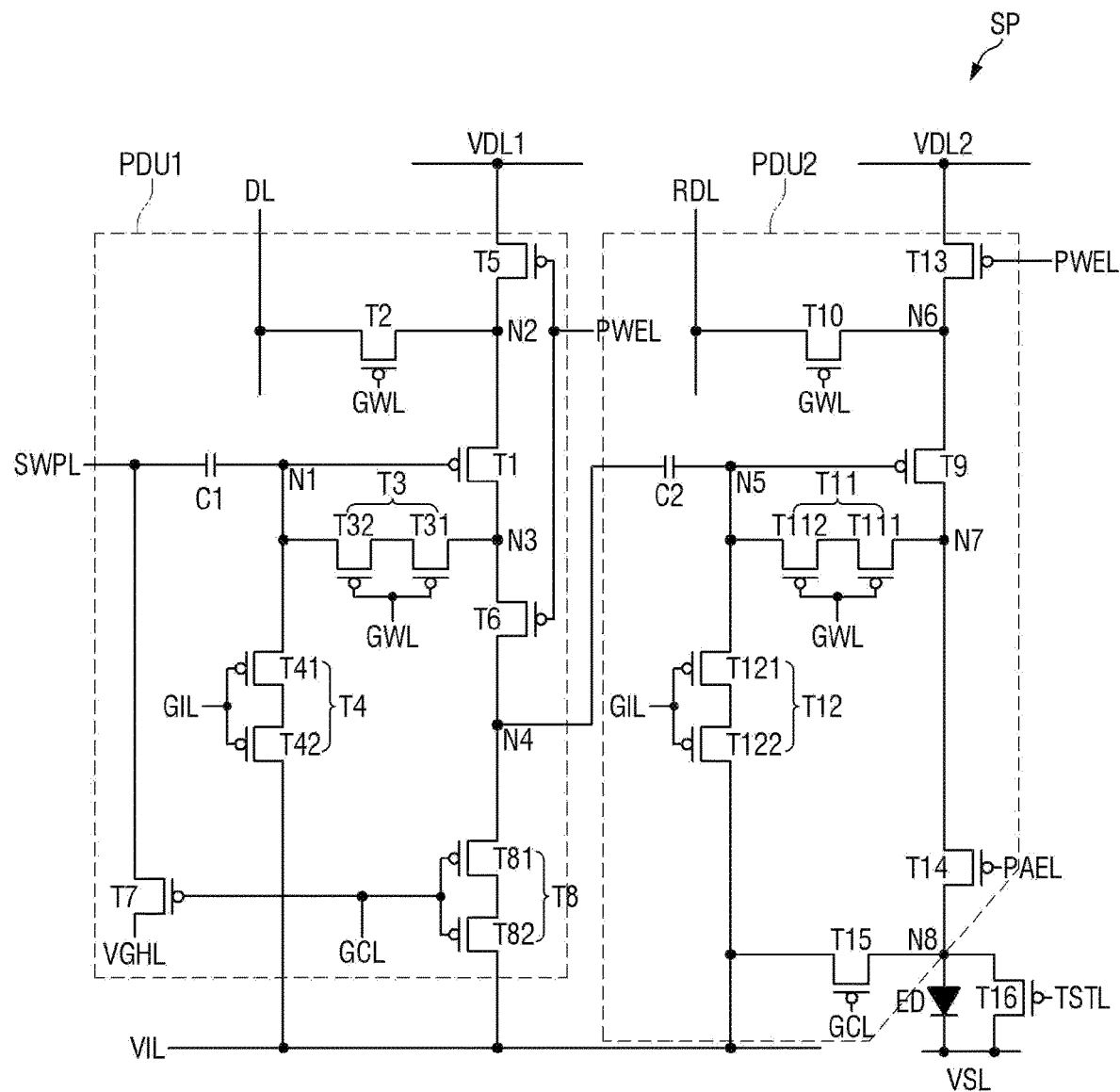
FIG. 3 is a circuit diagram of a pixel of a display device according to another embodiment of the present disclosure.

FIG. 3 is a circuit diagram of a pixel of a display device according to another embodiment of the present disclosure.

Referring to FIG. 3, a pixel SP may be connected to a scan initialization line GIL, a scan write line GWL, a scan control line GCL, a sweep line SWPL, a PWM emission line PWEL, and a PAM emission line PAEL. When the pixel SP is a first pixel SP1, the first pixel SP1 may be connected to a data line DL and a first PAM data line RDL as shown in FIG. 3. Here, the data line DL may be referred to as a first data line, and the first PAM data line RDL may be referred to as a second data line. A data voltage from the data line DL may be referred to as a first data voltage, and a first PAM data voltage from the first PAM data line RDL may be referred to as a second data voltage. When the pixel SP is a second pixel SP2, the second pixel SP2 may be connected to a data line DL and a second PAM data line GDL. When the pixel SP is a third pixel SP3, the third pixel SP3 may be connected to a data line DL and a third PAM data line BDL.

The pixel SP may be connected to a first power supply line VDL1 to which a first power supply voltage VDD1 is applied, a second power supply line VDL2 to which a second power supply voltage VDD2 is applied, a third power supply line VSL to which a third power supply voltage VSS is applied, an initialization voltage line VIL to which an initialization voltage VINT is applied, and a gate-off voltage line VGHL to which a gate-off voltage VGH is applied.

The pixel SP may include a first pixel driver PDU1, a second pixel driver PDU2, a sixteenth transistor T16, and a light-emitting element ED.

The light-emitting element ED may emit light in accordance with a driving current generated by the second pixel driver PDU2. The light-emitting element ED may be disposed between an eighth node N8 and the third power supply line VSL. The first electrode of the light-emitting element ED may be connected to the eighth node N8, which is connected to the second electrode of a fourteenth transistor T14, and the second electrode of the light-emitting element ED may be connected to the third power supply line VSL. The first electrode of the light-emitting element ED may be an anode, and the second electrode of the light-emitting element ED may be a cathode. The light-emitting element ED may be an inorganic light-emitting element including the first electrode, the second electrode, and an inorganic semiconductor between the first and second electrodes. For example, the light-emitting element ED may be a micro-light-emitting diode (LED) including an inorganic semiconductor, but the present disclosure is not limited thereto.

The first pixel driver PDU1 may generate a control current based on a data voltage from a data line DL, and may control the voltage of a fifth node N5 of the second pixel driver PDU2. The control current of the first pixel driver PDU1 may control a pulse width of a voltage applied to the first electrode of the light-emitting element ED. The first pixel driver PDU1 may perform PWM on the voltage applied to the first electrode of the light-emitting element ED. Thus, the first pixel driver PDU1 may correspond to (e.g., may be) a PWM unit (e.g., a PWM circuit).

The first pixel driver PDU1 may include first through eighth transistors T1 through T8, and a first capacitor C1.

The first transistor T1 may control the control current that flows between the first and second electrodes of the first transistor T1 based on a data voltage applied to a first node N1, which is connected to the gate electrode of the first transistor T1.

The second transistor T2 may be turned on based on a scan write signal from the scan write line GWL to supply the data voltage from the data line DL to a second node N2, which is connected to the first electrode of the first transistor T1. The gate electrode of the second transistor T2 may be connected to the scan write line GWL, the first electrode of the second transistor T2 may be connected to the data line DL, and the second electrode of the second transistor T2 may be connected to the second node N2.

The third transistor T3 may be turned on based on the scan write signal from the scan write line GWL to electrically connect a first node N1, which is connected to the gate electrode of the first transistor T1, and a third node N3, which is connected to the second electrode of the first transistor T1, to each other. In other words, when the third transistor T3 is turned on, the first transistor T1 may be diode-connected. Thus, the first transistor T1 may operate as a diode while the third transistor T3 is on.

The third transistor T3 may include a plurality of transistors, which are connected in series. For example, the third transistor T3 may include a (3-1)-th transistor T31 and a (3-2)-th transistor T32. The (3-1)-th and (3-2)-th transistors T31 and T32 may prevent or substantially prevent the voltage of the first node N1 from leaking through the third transistor T3. The gate electrode of the (3-1)-th transistor T31 may be connected to the scan write line GWL, the first electrode of the (3-1)-th transistor T31 may be connected to the third node N3, and the second electrode of the (3-1)-th transistor T31 may be connected to the first electrode of the (3-2)-th transistor T32. The gate electrode of the (3-2)-th transistor T32 may be connected to the scan write line GWL, the first electrode of the (3-2)-th transistor T32 may be connected to the second electrode of the (3-1)-th transistor T31, and the second electrode of the (3-2)-th transistor T32 may be connected to the first node N1.

The fourth transistor T4 may be turned on based on a scan initialization signal from the scan initialization line GIL to electrically connect the initialization voltage line VIL and the first node N1 to each other. The first node N1, which is connected to the gate electrode of the first transistor T1, may be discharged to as low of a voltage as that of the initialization voltage VINT while the fourth transistor T4 is on. A gate-on voltage VGL of the scan initialization signal may be different from the initialization voltage VINT of the initialization voltage line VIL. As the difference between the initialization voltage VINT and the gate-on voltage VGL is greater than the threshold voltage of the fourth transistor T4, the fourth transistor T4 may be stably turned on even after the application of the initialization voltage VINT to the first node N1. Thus, when the fourth transistor T4 is turned on, the first node N1 may stably receive the initialization voltage VINT, regardless of the threshold voltage of the fourth transistor T4.

The fourth transistor T4 may include a plurality of transistors, which are connected in series. For example, the fourth transistor T4 may include a (4-1)-th transistor T41 and (4-2)-th transistor T42. The (4-1)-th and (4-2)-th transistors T41 and T42 may prevent or substantially prevent the voltage of the first node N1 from leaking through the fourth transistor T4. The gate electrode of the (4-1)-th transistor T41 may be connected to the scan initialization line GIL, the first electrode of the (4-1)-th transistor T41 may be connected to the first node N1, and the second electrode of the (4-1)-th transistor T41 may be connected to the first electrode of the (4-2)-th transistor T42. The gate electrode of the (4-2)-th transistor T42 may be connected to the scan initialization line GIL, the first electrode of the (4-2)-th transistor T42 may be connected to the second electrode of the (4-1)-th transistor T41, and the second electrode of the (4-2)-th transistor T42 may be connected to the initialization voltage line VIL.

The fifth transistor T5 may be turned on based on a PWM emission signal from the PWM emission line PWEL to electrically connect the first power supply line VDL1 and the second node N2, which is connected to the first electrode of the first transistor T1, to each other. The gate electrode of the fifth transistor T5 may be connected to the PWM emission line PWEL, the first electrode of the fifth transistor T5 may be connected to the first power supply line VDL1, and the second electrode of the fifth transistor T5 may be connected to the second node N2.

The sixth transistor T6 may be turned on based on the PWM emission signal from the PWM emission line PWEL to electrically connect the third node N3, which is connected to the second electrode of the first transistor T1, and the fourth node N4, which is connected to a second capacitor electrode of the second capacitor C2, to each other. The gate electrode of the sixth transistor T6 may be connected to the PWM emission line PWEL, the first electrode of the sixth transistor T6 may be connected to the third node N3, and the second electrode of the sixth transistor T6 may be connected to the fourth node N4. Thus, the sixth transistor T6 may provide the control current to the fourth node N4, which is connected to the second capacitor electrode of the second capacitor C2, and the second capacitor C2 may control the voltage of the fifth node N5, which is connected to the gate electrode of the ninth transistor T9, thereby controlling the pulse width of a voltage applied to the first electrode of the light-emitting element ED.

Referring to the pixel SP of FIG. 2, the first transistor T1 may provide a control current to the eighth node N8, which is connected to the gate electrode of the fifteenth transistor T15, and the fifteenth transistor T15 may control the pulse width of a driving current flowing in the eighth transistor T8. The pixel SP of FIG. 3 controls the voltage of the gate electrode of the ninth transistor T9 by providing a control current to the second capacitor electrode of the second capacitor C2. Thus, the pixel SP of FIG. 3 may further minimize or reduce luminance deviations, when compared to the pixel SP of FIG. 2. Accordingly, the pixel SP of FIG. 3 may be simplified (e.g., may not include the fifteenth transistor T15 of FIG. 2), and may minimize or reduce luminance deviations by preventing or substantially preventing a duty distribution and an amplitude distribution to improve the threshold voltage distribution margin of the transistors.

Referring to FIG. 3, the seventh transistor T7 may be turned on based on a scan control signal from the scan control line GCL to provide the gate-off voltage VGH from the gate-off voltage line VGHL to a second capacitor electrode of the first capacitor C1, which is connected to the sweep line SWPL. Thus, variations in the voltage of the gate electrode of the first transistor T1 may be prevented or substantially prevented from being reflected in a sweep signal of the sweep line SWPL by the first capacitor C1 while the initialization voltage VINT is being applied to the gate electrode of the first transistor T1, and the data voltage from the data line DL and a threshold voltage Vth of the first transistor T1 are being programmed. The gate electrode of the seventh transistor T7 may be connected to the scan control line GCL, the first electrode of the seventh transistor T7 may be connected to the gate-off voltage line VGHL, and the second electrode of the seventh transistor T7 may be connected to the sweep line SWPL.

The eighth transistor T8 may be turned on based on the scan control signal from the scan control line GCL to electrically connect the fourth node N4 and the initialization voltage line VIL to each other. The fourth node N4 may be discharged to a voltage as low as the initialization voltage VINT while the eighth transistor T8 is on. A gate-on voltage VGL of the scan control signal may be different from the initialization voltage VINT. As the difference between the initialization voltage VINT and the gate-on voltage VGL is greater than the threshold voltage of the eighth transistor T8, the eighth transistor T8 may be stably turned on even after the application of the initialization voltage VINT to the fourth node N4. Thus, when the eighth transistor T8 is turned on, the fourth node N4 may stably receive the initialization voltage VINT, regardless of the threshold voltage of the eighth transistor T8.

The eighth transistor T8 may include a plurality of transistors, which are connected in series. For example, the eighth transistor T8 may include an (8-1)-th transistor T81 and an (8-2)-th transistor T82. The (8-1)-th and (8-2)-th transistors T81 and T82 may prevent or substantially prevent the voltage of the fourth node N4 from leaking through the eighth transistor T8. The gate electrode of the (8-1)-th transistor T81 may be connected to the scan control line GCL, the first electrode of the (8-1)-th transistor T81 may be connected to the fourth node N4, and the second electrode of the (8-1)-th transistor T81 may be connected to the first electrode of the (8-2)-th transistor T82. The gate electrode of the (8-2)-th transistor T82 may be connected to the scan control line GCL, the first electrode of the (8-2)-th transistor T82 may be connected to the second electrode of the (8-1)-th transistor T81, and the second electrode of the (8-2)-th transistor T82 may be connected to the initialization voltage line VIL.

The first capacitor C1 may be connected between the first node N1 and the sweep line SWPL. The first capacitor electrode of the first capacitor C1 may be connected to the first node N1, and the second capacitor electrode of the first capacitor C1 may be connected to the sweep line SWPL. The first capacitor C1 may maintain or substantially maintain a difference in electric potential between the first node N1 and the sweep line SWPL.

The second pixel driver PDU2 may generate a driving current to be provided to the light-emitting element ED, based on the first PAM data voltage from the first PAM data line RDL. The second pixel driver PDU2 may correspond to (e.g., may be) a PAM unit (e.g., a PAM circuit) for performing PAM. The second pixel driver PDU2 may be a constant current generation unit (e.g., a constant current generation circuit) that receives the same PAM data voltage, and generates the same driving current regardless of the luminance of the pixel SP.

The second pixel driver PDU2 may include ninth through fifteenth transistors T9 through T15, and the second capacitor C2.

The ninth transistor T9 may control a period for which a driving current flows, based on the voltage applied to the fifth node N5, which is connected to the gate electrode of the ninth transistor T9. The ninth transistor T9 may control the period for which the driving current is provided to the light-emitting element ED, based on the voltage of the fifth node N5.

The tenth transistor T10 may be turned on based on a scan write signal from the scan write line GWL to provide the first PAM data voltage from the first PAM data line RDL to a sixth node N6, which is connected to the first electrode of the ninth transistor T9. The gate electrode of the tenth transistor T10 may be connected to the scan write line GWL, the first electrode of the tenth transistor T10 may be connected to the first PAM data line RDL, and the second electrode of the tenth transistor T10 may be connected to the sixth node N6.

The eleventh transistor T11 may be turned on based on the scan write signal from the scan write line GWL to electrically connect the fifth node N5, which is connected to the gate electrode of the ninth transistor T9, and a seventh node N7, which is connected to the second electrode of the ninth transistor T9, to each other. In other words, when the eleventh transistor T11 is turned on, the ninth transistor T9 may be diode connected. Thus, the ninth transistor T9 may operate as a diode while the eleventh transistor T11 is on.

The eleventh transistor T11 may include a plurality of transistors, which are connected in series. For example, the eleventh transistor T11 may include an (11-1)-th transistor T111 and an (11-2)-th transistor T112. The (11-1)-th and (11-2)-th transistors T111 and T112 may prevent or substantially prevent the voltage of the fifth node N5 from leaking through the eleventh transistor T11. The gate electrode of the (11-1)-th transistor T111 may be connected to the scan write line GWL, the first electrode of the (11-1)-th transistor T111 may be connected to the seventh node N7, and the second electrode of the (11-1)-th transistor T111 may be connected to the first electrode of the (11-2)-th transistor T112. The gate electrode of the (11-2)-th transistor T112 may be connected to the scan write line GWL, the first electrode of the (11-2)-th transistor T112 may be connected to the second electrode of the (11-1)-th transistor T111, and the second electrode of the (11-2)-th transistor T112 may be connected to the fifth node N5.

The twelfth transistor T12 may be turned on based on the scan initialization signal from the scan initialization line GIL to electrically connect the fifth node N5 and the initialization voltage line VIL to each other. The fifth node N5 may be discharged to a voltage as low as the initialization voltage VINT while the twelfth transistor T12 is on. A gate-on voltage VGL of the scan initialization signal may be different from the initialization voltage VINT. As the difference between the initialization voltage VINT and the gate-on voltage VGL is greater than the threshold voltage of the twelfth transistor T12, the twelfth transistor T12 may be stably turned on even after the application of the initialization voltage VINT to the fifth node N5. Thus, when the twelfth transistor T12 is turned on, the fifth node N5 may stably receive the initialization voltage VINT, regardless of the threshold voltage of the twelfth transistor T12.

The twelfth transistor T12 may include a plurality of transistors, which are connected in series. For example, the twelfth transistor T12 may include a (12-1)-th transistor T121 and a (12-2)-th transistor T122. The (12-1)-th and (12-2)-th transistors T121 and T122 may prevent or substantially prevent the voltage of the fifth node N5 from leaking through the twelfth transistor T12. The gate electrode of the (12-1)-th transistor T121 may be connected to the scan initialization line GIL, the first electrode of the (12-1)-th transistor T121 may be connected to the fifth node N5, and the second electrode of the (12-1)-th transistor T121 may be connected to the first electrode of the (12-2)-th transistor T122. The gate electrode of the (12-2)-th transistor T122 may be connected to the scan initialization line GIL, the first electrode of the (12-2)-th transistor T122 may be connected to the second electrode of the (12-1)-th transistor T121, and the second electrode of the (12-2)-th transistor T122 may be connected to the initialization voltage line VIL.

The thirteenth transistor T13 may be turned on based on the PWM emission signal from the PWM emission line PWEL to electrically connect the sixth node N6, which is connected to the first electrode of the ninth transistor T9, and the second power supply line VDL2 to each other. The gate electrode of the thirteenth transistor T13 may be connected to the PWM emission line PWEL, the first electrode of the thirteenth transistor T13 may be connected to the second power supply line VDL2, and the second electrode of the thirteenth transistor T13 may be connected to the sixth node N6.

The fourteenth transistor T14 may be turned on based on a PAM emission signal from the PAM emission line PAEL to electrically connect the seventh node N7 and the eighth node N8, which is connected to the first electrode of the light-emitting element ED, to each other. The gate electrode of the fourteenth transistor T14 may be connected to the PAM emission line PAEL, the first electrode of the fourteenth transistor T14 may be connected to the seventh node N7, and the second electrode of the fourteenth transistor T14 may be connected to the eighth node N8.

The fifteenth transistor T15 may be turned on based on the scan control signal from the scan control line GCL to electrically connect the initialization voltage line VIL and the eighth node N8, which is connected to the first electrode of the light-emitting element ED, to each other. The eighth node N8 may be discharged to a voltage as low as the initialization voltage VINT while the fifteenth transistor T15 is on. The gate electrode of the fifteenth transistor T15 may be connected to the scan control line GCL, the first electrode of the fifteenth transistor T15 may be connected to the eighth node N8, and the second electrode of the fifteenth transistor T15 may be connected to the initialization voltage line VIL.

The second capacitor C2 may be connected between the fifth node N5, which is connected to the gate electrode of the ninth transistor T9, and the fourth node N4, which is connected to the second electrode of the sixth transistor T6. The first capacitor electrode of the second capacitor C2 may be connected to the fifth node N5, and the second capacitor electrode of the second capacitor C2 may be connected to the fourth node N4. The second capacitor electrode of the second capacitor C2 may receive the control current from the first pixel driver PDU1. The second capacitor C2 may maintain or substantially maintain a difference in electric potential between the fourth node N4 and the fifth node N5, and may control the voltage of the fifth node N5 based on a variation in the control current. Thus, the second capacitor C2 may control a period for which the ninth transistor T9 is turned on by controlling the voltage of the fifth node N5.

The sixteenth transistor T16 may be turned on based on a test signal from a test signal line TSTL to electrically connect the eighth node N8 and the third power supply line VSL to each other. The gate electrode of the sixteenth transistor T16 may be connected to the test signal line TSTL, the first electrode of the sixteenth transistor T16 may be connected to the eighth node N8, and the second electrode of the sixteenth transistor T16 may be connected to the third power supply line VSL.

One of the first and second electrodes of each of the first through sixteenth transistors T1 through T16 may be a source electrode, and the other electrode of each of the first through sixteenth transistors T1 through T16 may be a drain electrode. The semiconductor layers of the first through sixteenth transistors T1 through T16 may be formed from among at least one of polysilicon, amorphous silicon, and an oxide semiconductor. For example, in a case where the semiconductor layers of the first through sixteenth transistors T1 through T16 are formed of polysilicon, the semiconductor layers of the first through sixteenth transistors T1 through T16 may be formed by a low-temperature polysilicon (LTPS) process. In another example, the semiconductor layers of some of the first through sixteenth transistors T1 through T16 may include polycrystalline silicon, monocrystalline silicon, LTPS, and/or amorphous silicon, and the semiconductor layers of the other transistors may include an oxide semiconductor.

FIG. 3 illustrates that the first through sixteenth transistors T1 through T16 are formed as P-type MOSFETs, but the present disclosure is not limited thereto. As another example, the first through sixteenth transistors T1 through T16 may be formed as N-type MOSFETs.

As the pixel SP of FIG. 3 includes fewer transistors and fewer capacitors than those of the pixel SP of FIG. 2, a duty distribution and the amplitude distribution may both be prevented or substantially prevented from being caused in one transistor, and luminance deviations may be minimized or reduced by improving a margin for the threshold voltage distribution of the transistors.

Figure 4:
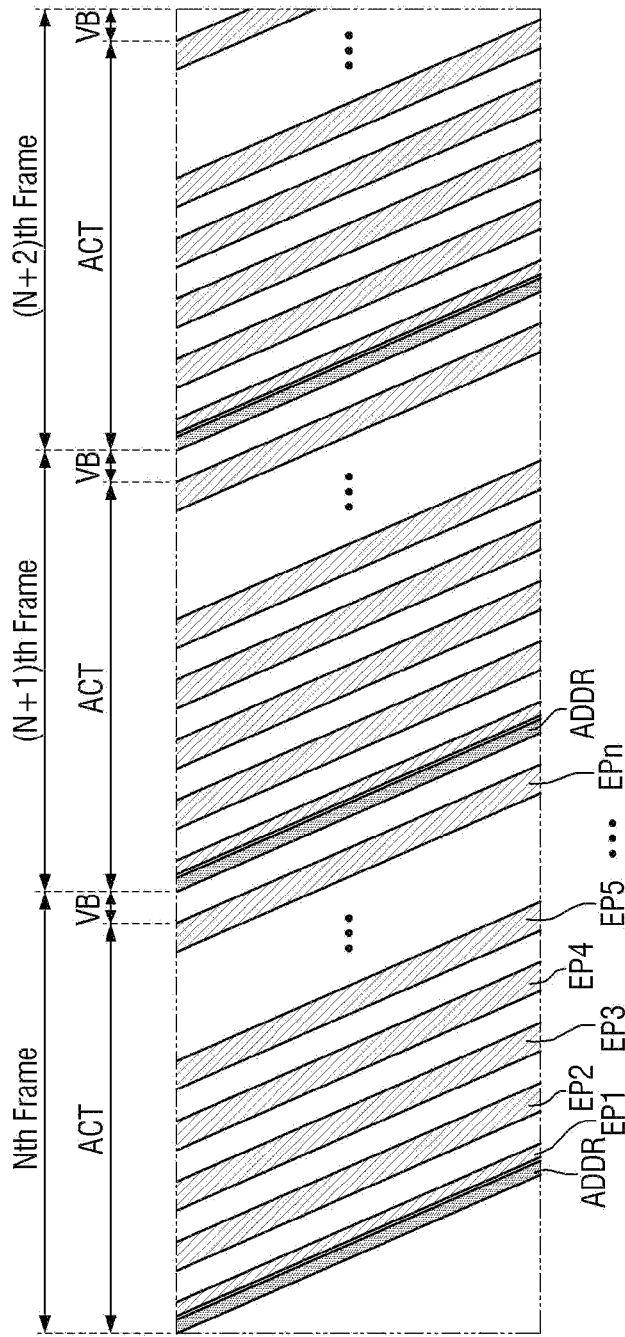
FIG. 4 illustrates an example operation of the display device of FIG. 1 during N-th through (N+2)-th frames.

FIG. 4 illustrates an example operation of the display device of FIG. 1 during N-th through (N+2)-th frames.

Referring to FIG. 4, each of the N-th through (N+2) frames, where N is a natural number, may include an active period ACT and a blank period VB. The active period ACT may include an address period ADDR and first through n-th emission periods EP1 through EPn, where n is a natural number. During the address period ADDR, data voltages and first, second, or third PAM data voltages are provided to each of the pixels SP. During the first through n-th emission periods EP1 through EPn, the light-emitting elements ED of the pixels SP emit light. The blank period VB may be a period during which the pixels SP pause without operating.

For example, the address period ADDR and the first emission period EP1 may correspond to about five horizontal periods, and each of the second through n-th emission periods EP2 through EPn may correspond to about twelve horizontal periods. However, the present disclosure is not limited thereto. For example, the active period ACT may include 25 emission periods, but the number of emission periods included in the active period ACT is not particularly limited.

The pixels SP may sequentially receive data voltages and first, second, or third PAM data voltages, in a row-by-row basis during the address period ADDR. For example, first through n-th rows of pixels SP may sequentially receive data voltages and first, second, or third PAM data voltages during the address period ADDR.

The pixels SP may sequentially emit light, in a row-by-row basis, during each of the first through n-th emission periods EP1 through EPn. For example, the first through n-th rows of pixels SP may sequentially emit light during each of the first through n-th emission periods EP1 through EPn.

Figure 5:
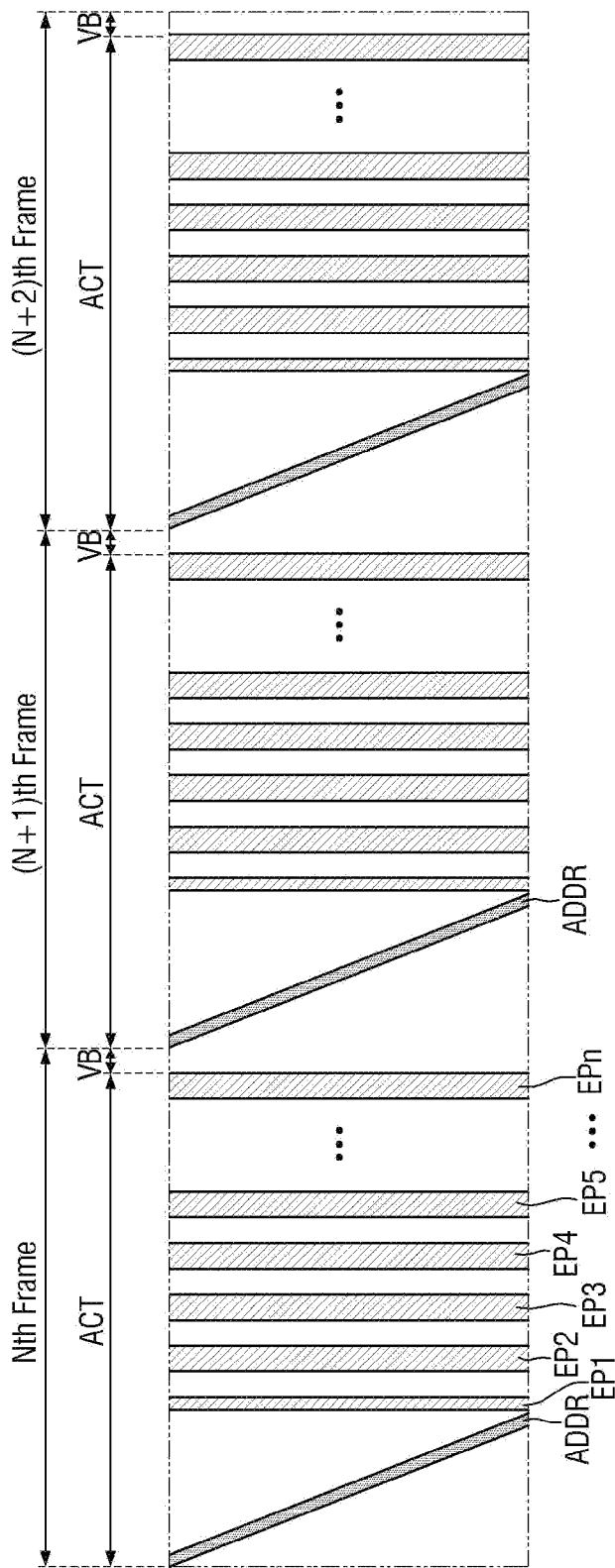
FIG. 5 illustrates another example operation of the display device of FIG. 1 during the N-th through (N+2)-th frames.

FIG. 5 illustrates another example operation of the display device of FIG. 1 during the N-th through (N+2)-th frames.

The embodiment of FIG. 5 may be different from the embodiment of FIG. 4, in that in FIG. 5, the first pixels SP1, the second pixels SP2, and the third pixels SP3 emit light concurrently (e.g., at the same or substantially the same time) with each other during each of the first through n-th emission periods EP1 through EPn. Thus, redundant description with reference to FIG. 5 will not be repeated.

Figure 6:
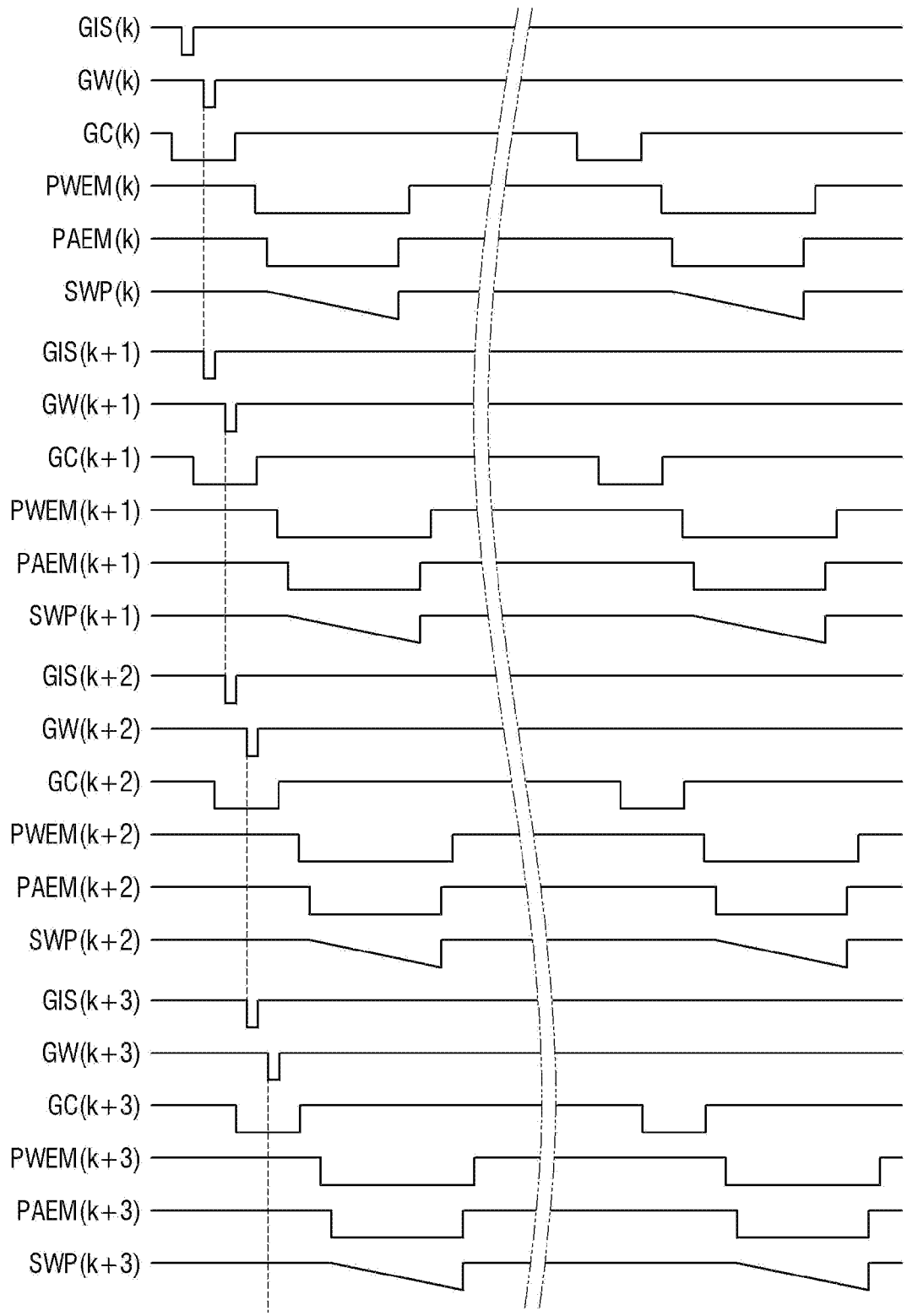
FIG. 6 is a waveform diagram illustrating signals applied to k-th through (k+3)-th rows of pixels of the display device of FIG. 3.

FIG. 6 is a waveform diagram illustrating signals applied to k-th through (k+3)-th rows of pixels of the display device of FIG. 3.

Referring to FIG. 6, the k-th row of pixels SP may be connected to a k-th scan initialization line, a k-th scan write line, a k-th scan control line, a k-th sweep line, a k-th PWM emission line, and a k-th PAM emission line, where k is a natural number.

The k-th scan initialization line may provide a k-th scan initialization signal GIS(k), and the k-th scan write line may provide a k-th scan write signal GW(k). The k-th scan control line may provide a k-th scan control signal GC(k), and the k-th sweep line may provide a k-th sweep signal SWP(k). The k-th PWM emission line may provide a k-th PWM emission signal PWEM(k), and the k-th PAM emission line may provide a k-th PAM emission signal PAEM(k).

The k-th scan initialization signal GIS(k), the k-th scan write signal GW(k), the k-th scan control signal GC(k), the k-th sweep signal SWP(k), the k-th PWM emission signal PWEM(k), and the k-th PAM emission signal PAEM(k) may be sequentially shifted by as much as one horizontal period 1H. A (k+1)-th scan initialization signal GIS(k+1), a (k+1)-th scan write signal GW(k+1), a (k+1)-th scan control signal GC(k+1), a (k+1)-th sweep signal SWP(k+1), a (k+1)-th PWM emission signal PWEM(k+1), and a (k+1)-th PAM emission signal PAEM(k+1) may be sequentially shifted by as much as one horizontal period 1H. A (k+2)-th scan initialization signal GIS(k+2), a (k+2)-th scan write signal GW(k+2), a (k+2)-th scan control signal GC(k+2), a (k+2)-th sweep signal SWP(k+2), a (k+2)-th PWM emission signal PWEM(k+2), and a (k+2)-th PAM emission signal PAEM(k+2) may be sequentially shifted by as much as one horizontal period 1H. A (k+3)-th scan initialization signal GIS(k+3), a (k+3)-th scan write signal GW(k+3), a (k+3)-th scan control signal GC(k+3), a (k+3)-th sweep signal SWP(k+3), a (k+3)-th PWM emission signal PWEM(k+3), and a (k+3)-th PAM emission signal PAEM(k+3) may be sequentially shifted by as much as one horizontal period 1H. The k-th scan write signal GW(k) may be obtained by shifting the k-th scan initialization signal GIS(k) by as much as one horizontal period H1, and the (k+1)-th scan write signal GW(k+1) may be obtained by shifting the (k+1)-th scan initialization signal GIS(k+1) by as much as one horizontal period H1. Thus, the (k+1)-th scan initialization signal GIS(k+1) and the k-th scan write signal GW(k) may be output concurrently (e.g., at the same or substantially at the same time).

Figure 7:
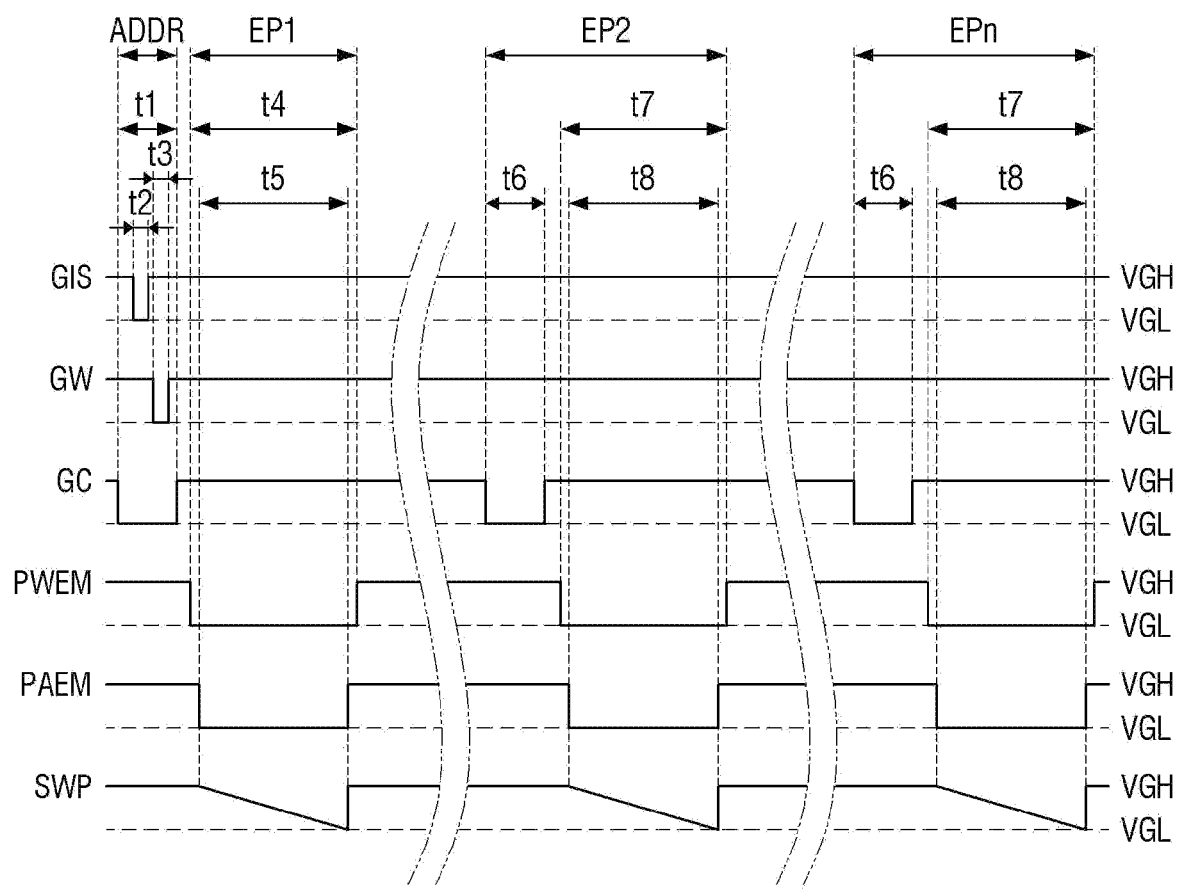
FIG. 7 is a waveform diagram illustrating signals applied to the pixel of FIG. 3 during an address period and emission periods of a frame.

FIG. 7 is a waveform diagram illustrating signals applied to the pixel of FIG. 3 during an address period and emission periods of a frame.

Referring to FIG. 7, a scan initialization signal GIS may control the turning on of the fourth and twelfth transistors T4 and T12. A scan write signal GW may control the turning on of the second, third, tenth, and eleventh transistors T2, T3, T10, and T11. A scan control signal GC may control the turning on of the seventh, eighth, and fifteenth transistors T7, T8, and T15. A PWM emission signal PWEM may control the turning on of the fifth, sixth, and thirteenth transistors T5, T6, and T13. A PAM emission signal PAEM may control the turning on of the fourteenth transistor T14. The scan initialization signal GIS and the scan write signal GW may be generated for every frame (e.g., may be generated once for each frame). The scan control signal GC, the PWM emission signal PWEM, and the PAM emission signal PAEM may be generated for every emission period (e.g., may be generated for each emission period of one frame). Accordingly, the scan initialization signal GIS and the scan write signal GW may be generated once during one frame, and the scan control signal GC, the PWM emission signal PWEM, and the PAM emission signal PAEM may be generated for as many times as there are emission periods in one frame, for example, such as n times for the n emission periods EP1 through EPn of the one frame in the example shown in FIG. 7.

An address period ADDR may include first through third periods t1 through t3. The first period t1 may be a period for initializing the fourth and eighth nodes N4 and N8, and uniformly maintaining or substantially maintaining the voltage of the second capacitor electrode of the first capacitor C1. The second period t2 may be a period for initializing the first and fifth nodes N1 and N5. The third period t3 may be a period for sampling a data voltage Vdata and a threshold voltage Vth of the first transistor T1 from the first node N1, which is connected to the gate electrode of the first transistor T1. The third period t3 may be a period for sampling a first PAM data voltage VPAM of a first PAM data line RDL and a threshold voltage Vth of the ninth transistor T9 from the eighth node N8. The third period t3 may follow the second period t2. The first period t1 may start earlier than the second period t2, and may end later than the third period t3. In other words, the first period t1 may include the second and third periods t2 and t3.

A first emission period EP1 may include fourth and fifth periods t4 and t5. The fourth period t4 may be a period for applying a control current Ic to the fourth node N4, and the fifth period t5 may be a period for controlling a duration for which the ninth transistor T9 is on based on the control current IC, and applying a driving current Idr to the light-emitting element ED.

Each of second through n-th emission periods EP2 through EPn may include sixth through eighth periods t6 through t8. The sixth period t6 may be a period for initializing the fourth and eighth nodes N4 and N8, and uniformly maintaining or substantially maintaining the voltage of the second capacitor electrode of the first capacitor C1. The seventh period t7 may be the same or substantially the same period as the fourth period t4, and the eighth period t8 may be the same or substantially the same period as the fifth period t5, and thus, redundant description thereof may not be repeated.

The first through n-th emission periods EP1 through EPn may be spaced apart from one another by as much as several horizontal periods to dozens of horizontal periods.

The scan control signal GC may have the gate-on voltage VGL during the first and sixth periods t1 and t6, and may have the gate-off voltage VGH during other periods. The scan initialization signal GIS may have the gate-on voltage VGL during the second period t2, and may have the gate-off voltage VGH during other periods. The scan write signal GW may have the gate-on voltage VGL during the third period t3, and may have the gate-off voltage VGH during other periods. The gate-off voltage VGH may be higher than the gate-on voltage VGL, but the present disclosure is not limited thereto.

The PWM emission signal PWEM may have the gate-on voltage VGL during the fourth and seventh periods t4 and t7, and may have the gate-off voltage VGH during other periods. The PAM emission signal PAEM may have the gate-on voltage VGL during the fifth and eighth periods t5 and t8, and may have the gate-off voltage VGH during other periods.

A sweep signal SWP may have a triangular wave pulse during the fifth and eighth periods t5 and t8, and may have the gate-off voltage VGH during other periods. For example, the sweep signal SWP may linearly decrease from the gate-off voltage VGH to the gate-on voltage VGL during the fifth period t5, and may begin to increase from the gate-on voltage VGL to the gate-off voltage VGH at the end of the fifth period t5.

Figure 8:
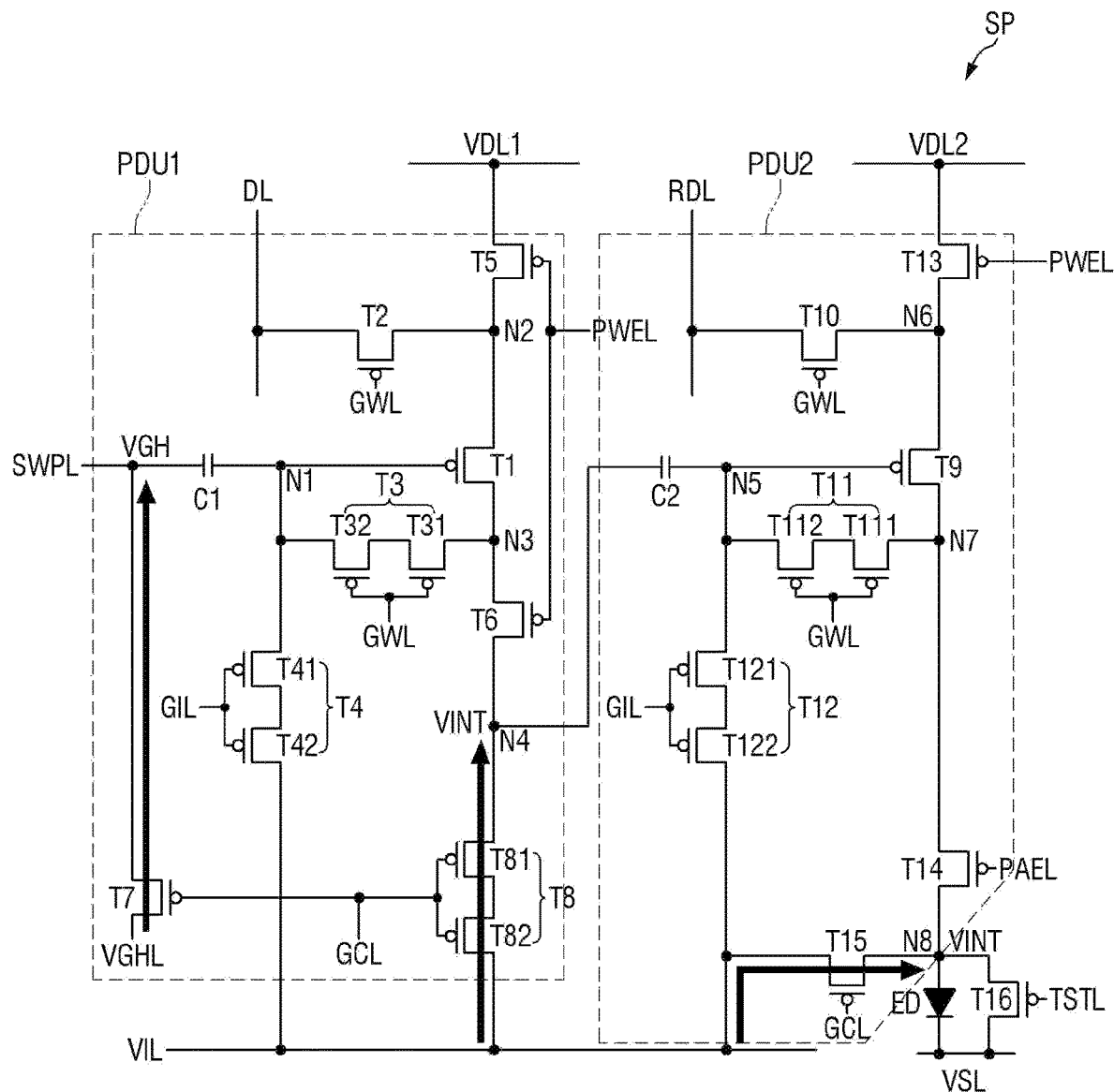
FIG. 8 is a circuit diagram illustrating an operation of the pixel of FIG. 3 during first and second periods.

FIG. 8 is a circuit diagram illustrating an operation of the pixel of FIG. 3 during the first and sixth periods t1 and t6.

Referring to FIGS. 3, 7, and 8, the seventh, eighth, and fifteenth transistors T7, T8, and T15 may be turned on based on the scan control signal GC during the first and sixth periods t1 and t6. The gate-off voltage VGH may be provided to the second capacitor electrode of the first capacitor C1 through the seventh transistor T7. The initialization voltage VINT may be provided to the fourth node N4, which is connected to the second capacitor electrode of the second capacitor C2, through the eighth transistor T8. The initialization voltage VINT may be provided to the eighth node N8, which is connected to the first electrode of the light-emitting element ED, through the fifteenth transistor T15.

Figure 9:
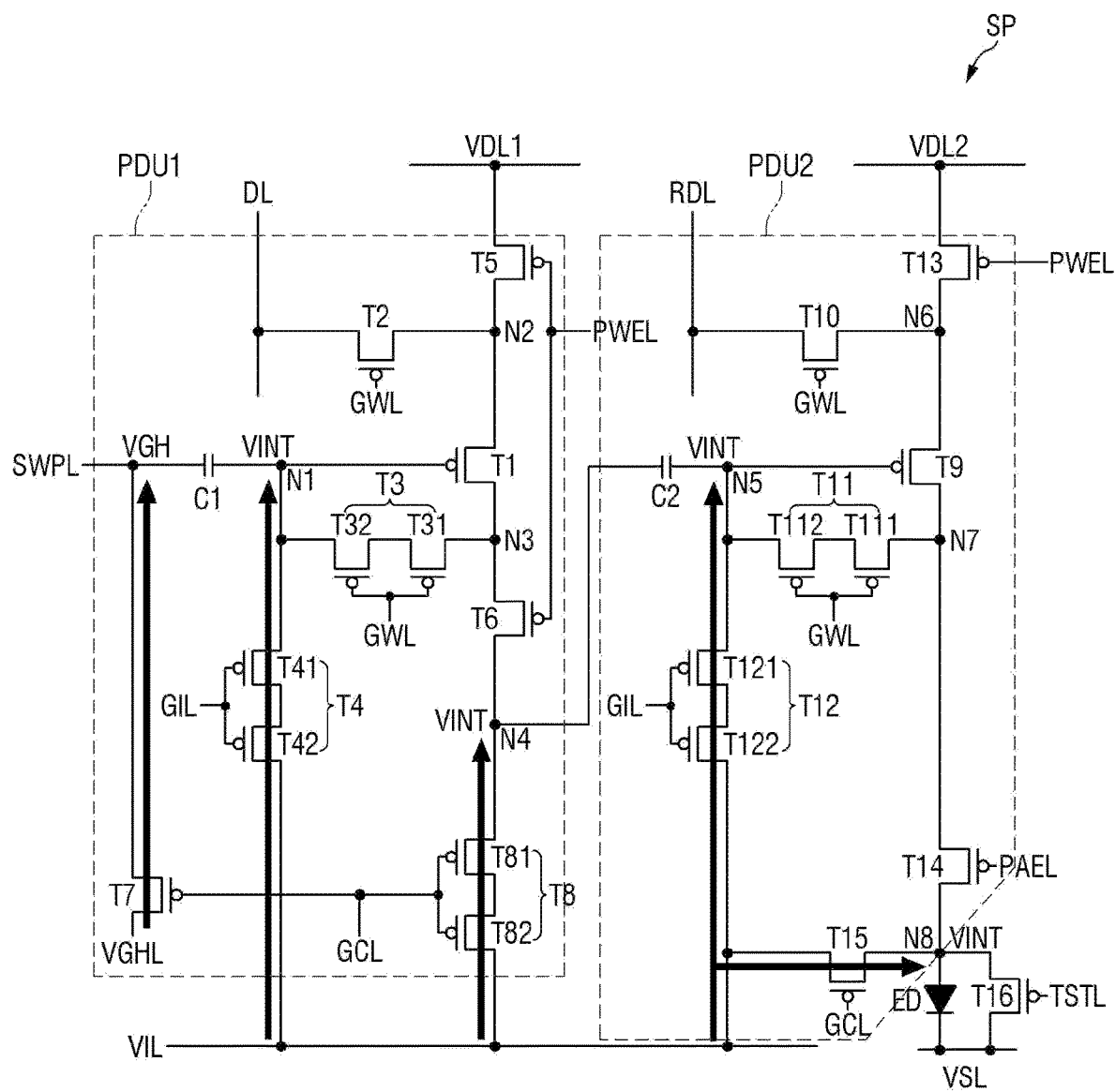
FIG. 9 is a circuit diagram illustrating an operation of the pixel of FIG. 3 during a second period.

FIG. 9 is a circuit diagram illustrating an operation of the pixel of FIG. 3 during the second period t2.

Referring to FIGS. 3, 7, and 9, the fourth and twelfth transistors T4 and T12 may be turned on based on the scan initialization signal GIS during the second period t2. The initialization voltage VINT may be provided to the first node N1, which is connected to the gate electrode of the first transistor T1, through the fourth transistor T4. The initialization voltage VINT may be provided to the fifth node N5, which is connected to the gate electrode of the ninth transistor T9, through the twelfth transistor T12.

As the first period t1 includes the second period t2, the seventh, eighth, and fifteenth transistors T7, T8, and T14 may be maintained or substantially maintained to be turned on during the second period t2.

Figure 10:
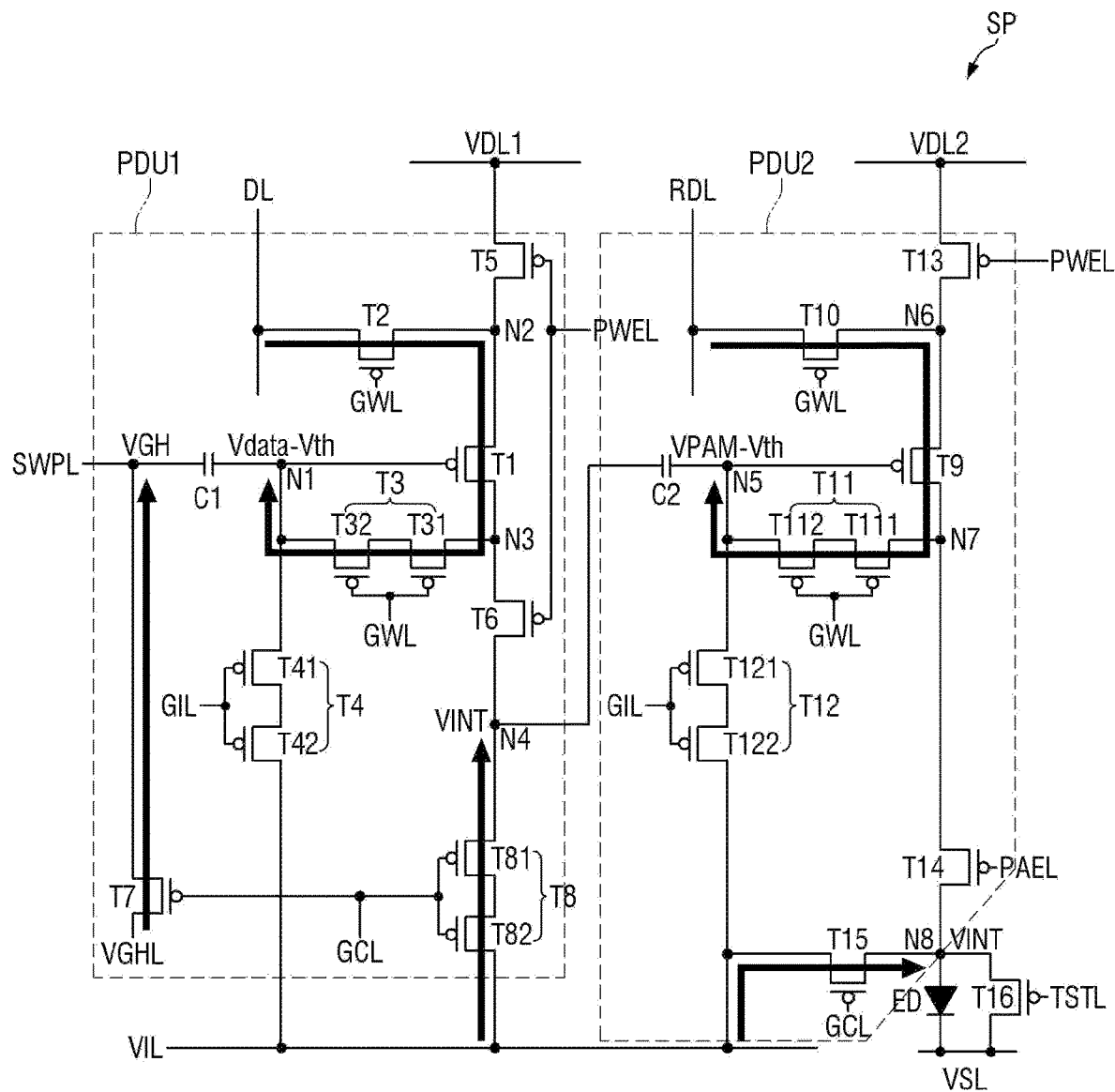
FIG. 10 is a circuit diagram illustrating an operation of the pixel of FIG. 3 during a third period.

FIG. 10 is a circuit diagram illustrating an operation of the pixel of FIG. 3 during the third period t3.

Referring to FIGS. 3, 7, and 10, the second, third, tenth, and eleventh transistors T2, T3, T10, and T11 may be turned on based on the scan write signal GW during the third period t3.

The data voltage Vdata may be provided to the second node N2, which is connected to the first electrode of the first transistor T1, through the second transistor T2. In this case, a voltage Vsg between the first electrode and the gate electrode of the first transistor T1 (where Vsg=Vdata-VINT) may be greater than the threshold voltage Vth of the first transistor T1, and thus, the first transistor T1 may be turned on.

As the third transistor T3 is turned on, the second electrode and the gate electrode of the first transistor T1 may be electrically connected to each other, and thus, the first transistor T1 may operate as a diode. The first transistor T1 may be turned on until the voltage Vsg of the first transistor T1 reaches as high as the threshold voltage Vth of the first transistor T1. Thus, the voltage of the first node N1, which is connected to the gate electrode of the first transistor T1, may increase from the initialization voltage VINT to a voltage corresponding to the threshold voltage Vth subtracted from the data voltage Vdata (e.g., Vdata-Vth). For example, in a case where the first transistor T1 is formed as a P-type MOSFET, the threshold voltage Vth of the first transistor T1 may be smaller than 0V, but the present disclosure is not limited thereto.

The first PAM data voltage VPAM may be provided to the sixth node N6, which is connected to the first electrode of the ninth transistor T9, through the tenth transistor T10. In this case, a voltage Vsg between the first electrode and the gate electrode of the ninth transistor T9 (where Vsg=VPAM-VINT) may be greater than the threshold voltage Vth of the ninth transistor T9, and thus, the ninth transistor T9 may be turned on. As the eleventh transistor T11 is turned on, the second electrode and the gate electrode of the ninth transistor T9 may be electrically connected to each other, and thus, the ninth transistor T9 may operate as a diode. The ninth transistor T9 may be turned on until the voltage Vsg of the eighth transistor T8 reaches as high as the threshold voltage Vth of the ninth transistor T9. Thus, the voltage of the fifth node N5, which is connected to the gate electrode of the ninth transistor T9, may increase from the initialization voltage VINT to a voltage corresponding to the threshold voltage Vth subtracted from the first PAM data voltage VPAM (e.g., VPAM-Vth). For example, in a case where the ninth transistor T9 is formed as a P-type MOSFET, the threshold voltage Vth of the ninth transistor T9 may be smaller than 0V, but the present disclosure is not limited thereto.

As the first period t1 includes the third period t3, the seventh, eighth, and fifteenth transistors T7, T8, and T14 may be maintained or substantially maintained to be turned on during the third period t3.

Figure 11:
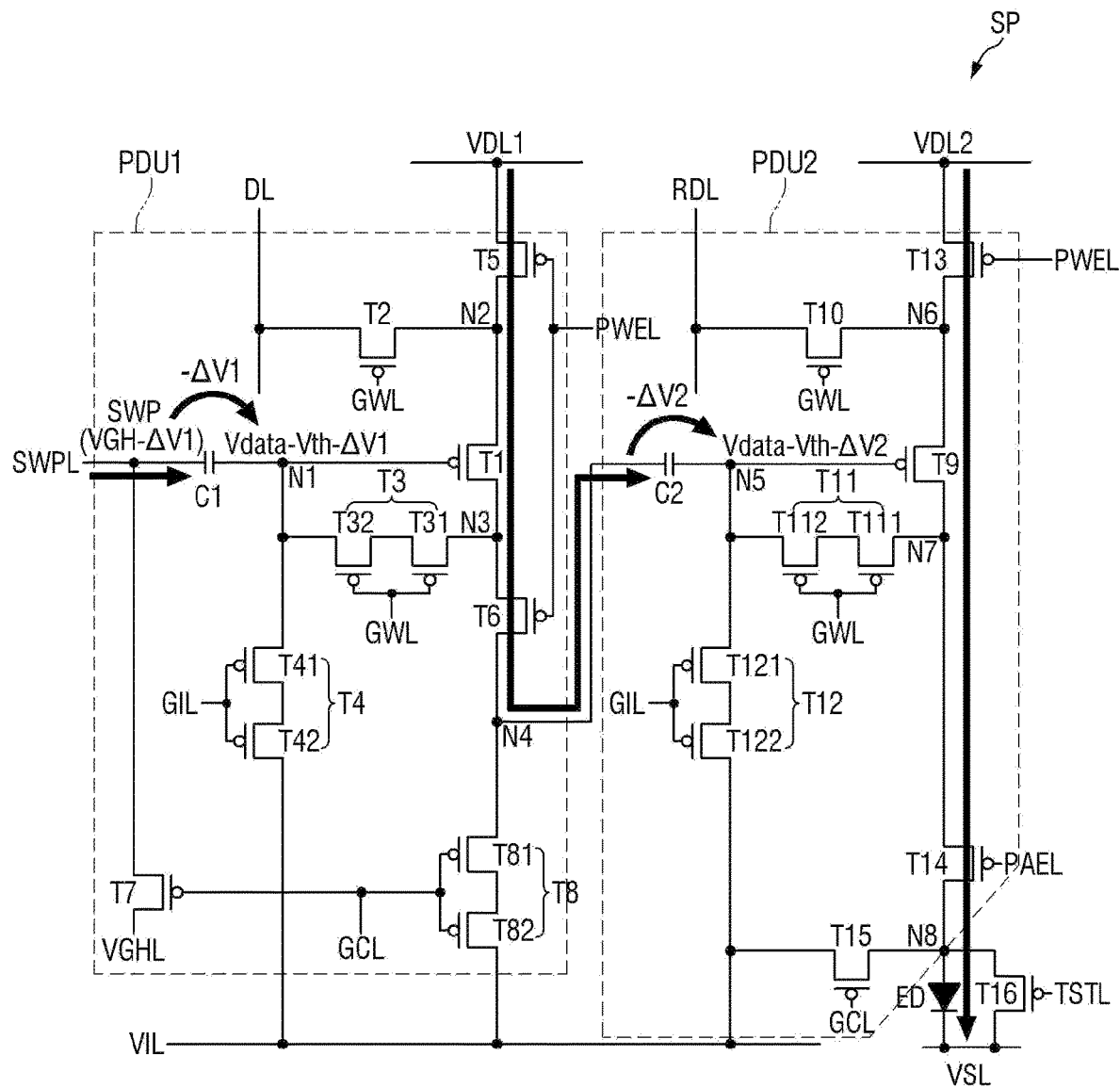
FIG. 11 is a circuit diagram illustrating an operation of the pixel of FIG. 3 during fourth, fifth, seventh, and eighth periods.

FIG. 11 is a circuit diagram illustrating an operation of the pixel of FIG. 3 during the fourth, fifth, seventh, and eighth periods t4, t5, t7, and t8.

Referring to FIGS. 3, 7, and 11, the fifth, sixth, and thirteenth transistors T5, T6, and T13 may be turned on based on the PWM emission signal PWEM during the fourth and seventh periods t4 and t7, and the fourteenth transistor T14 may be turned on based on the PAM emission signal PAEM during the fifth and eighth periods t5 and t8.

The first power supply voltage VDD1 may be provided to the second node N2, which is connected to the first electrode of the first transistor T1, through the fifth transistor T5. As the sixth transistor T6 is turned on, the third node N3, which is connected to the second electrode of the first transistor T1, may be electrically connected to the fourth node N4, which is connected to the second capacitor electrode of the second capacitor C2. However, the voltage of the first node N1 (e.g., Vdata-Vth) may be the same as or substantially the same as, or higher than, the first power supply voltage VDD1 until the fourth period t4 begins. Thus, the first transistor T1 may be turned off until the fourth period t4 begins.

A control current Ic flowing in the first transistor T1 during the fourth period t4 may not depend on the threshold voltage Vth of the first transistor T1, as indicated by Equation (1):

$$Ic=k''(Vsg-Vth)^2=k''(VDD1-Vdata+Vth-Vth)^2=k''(VDD1-Vdata)^2$$

In Equation (1), k'' denotes a proportional coefficient determined by a structure and physical characteristics of the first transistor T1, Vth denotes the threshold voltage Vth of the first transistor T1, VDD1 denotes the first power supply voltage VDD1, and Vdata denotes the data voltage Vdata.

The period for which the control current Ic is applied to the fourth node N4 may vary depending on the magnitude of the data voltage Vdata applied to the first transistor T1. As the voltage of the fourth node N4 varies depending on the magnitude of the data voltage Vdata, the period for which the ninth transistor T9 is turned on may be controlled. Thus, an actual emission period (e.g., the duration for which the driving current Idr is applied to the light-emitting element ED during the fifth period t5) may be controlled by controlling the period for which the ninth transistor T9 is turned on.

The sweep signal SWP may linearly decrease from the gate-off voltage VGH to the gate-on voltage VGL during the fifth period t5. A voltage variation in the sweep signal SWP may be reflected into the first node N1 by the first capacitor C1, and the voltage of the first node N1 may correspond to (e.g., may be) Vdata-Vth-$\Delta$V1, where $\Delta$V1 corresponds to the voltage variation of the sweep signal SWP. Thus, during the fifth period t5, as the voltage of the sweep signal SWP decreases, the voltage of the first node N1 may linearly decrease.

A control current Ic flowing in the first transistor T1 may be provided to the fourth node N4, which is connected to the second capacitor electrode of the second capacitor C2. In a case where the control current Ic varies due to a voltage drop in the sweep signal SWP, a voltage variation $\Delta$V2 in the fourth node N4 may be reflected into the fifth node N5, which is connected to the gate electrode of the ninth transistor T9, by the second capacitor C2.

A driving current Idr flowing in accordance with the voltage (e.g., VPAM-Vth) of the fifth node N5, which is connected to the gate electrode of the ninth transistor T9, may be provided to the fourteenth transistor T14. The fourteenth transistor T14 may be turned on during the fifth period t5 to provide the driving current Idr to the light-emitting element ED. The driving current Idr may not depend on the threshold voltage Vth of the ninth transistor T9, as indicated by Equation (2):

$$Idr = k'(Vsg-Vth)^2 = k'(VDD2-VPAM+Vth-Vth)^2 = k'(VDD2-VPAM)^2$$

In Equation (2), k' denotes a proportional coefficient determined by a structure and physical characteristics of the ninth transistor T9, Vth denotes the threshold voltage Vth of the ninth transistor T9, VDD2 denotes the second power supply voltage VDD2, and VPAM denotes the first PAM data voltage VPAM.

For example, in a case where the data voltage Vdata is of a peak black grayscale (e.g., is a peak black gray-level voltage), the first transistor T1 may be turned on throughout the entire fifth period t5 in response to a decrease in the voltage of the sweep signal SWP. In this example, the control current Ic of the first transistor T1 may flow to the fourth node N4 throughout the entire fifth period t5, and the voltage of the fourth node N4 may rise to a high level beginning from the fifth period t5. Thus, the ninth transistor T9 may be turned off during the fifth period t5. As the driving current Idr is not applied to the light-emitting element ED, and the voltage of the first electrode of the light-emitting element ED is maintained or substantially maintained at the initialization voltage VINT, the light-emitting element ED may not emit light during the fifth period t5.

In another example, in a case where the data voltage Vdata is of a gray grayscale (e.g., is a gray gray-level voltage), the first transistor T1 may be turned on during only a part of a second half of the fifth period t5 in response to a decrease in the voltage of the sweep signal SWP. In this example, the control current Ic of the first transistor T1 may flow to the fourth node N4 during a part of the second half of the fifth period t5, and due to the second capacitor C2, the voltage of the fifth node N5 may have a high level beginning from the second half of the fifth period t5. Thus, the ninth transistor T9 may be turned off during a part of the second half of the fifth period t5. The driving current Idr may be applied to the light-emitting element ED during a part of a first half of the fifth period t5, but not during a part of the second half of the fifth period t5. The light-emitting element ED may emit light during a part of the first half of the fifth period t5.

In yet another example, in a case where the data voltage Vdata is of a peak white grayscale (e.g., is a peak white gray-level voltage), the first transistor T1 may be turned off throughout the entire fifth period t5, regardless of a decrease in the voltage of the sweep signal SWP. In this example, the control current Ic of the first transistor T1 may not flow to the fourth node N4 throughout the entire fifth period t5, and the voltage of the fifth node N5 may be maintained or substantially maintained at the initialization voltage VINT throughout the entire fifth period t5. Thus, the ninth transistor T9 may be turned on throughout the entire fifth period t5. The driving current Idr may be applied to the light-emitting element ED throughout the entire fifth period t5, and thus, the light-emitting element ED may emit light throughout the entire fifth period t5.

Accordingly, the emission period of the light-emitting element ED may be controlled by controlling the data voltage Vdata, which is applied to the gate electrode of the first transistor T1. Thus, the magnitude of the driving current Idr, which is applied to the light-emitting element ED, may be uniformly maintained or substantially maintained, and thus, the pulse width of a voltage applied to the first electrode of the light-emitting element ED may be controlled, thereby controlling the grayscale (e.g., the gray-level) or luminance of a corresponding pixel SP.

For example, in a case where a size of the digital video data that is converted into the data voltage is 8 bits, the digital video data converted into a peak black-grayscale (e.g., a peak black gray-level) data voltage may be zero, the digital video data converted into a peak white-grayscale (e.g., a peak white gray-level) data voltage may be 255, and the digital video data converted into a gray-grayscale (e.g., a gray gray-level) data voltage may range between 0 and 255.

The seventh and eighth periods t7 and t8 may be the same or substantially the same as the fourth and fifth periods t4 and t5, respectively. During each of the second through n-th emission periods EP2 through EPn, the fourth and eighth nodes N4 and N8 may be initialized, and a duration for which the driving current Idr, which is generated based on the first PAM data voltage written to the gate electrode of the ninth transistor T9, is applied to the light-emitting element ED may be controlled based on the data voltage Vdata written to the gate electrode of the first transistor T1 during the address period ADDR.

As the test signal from the test signal line TSTL is applied as the gate-off voltage VGH during the active period ACT of the N-th frame, the sixteenth transistor T16 may be turned off during the active period ACT of the N-th frame.

The second pixels SP2 and the third pixels SP3 may operate in the same or substantially the same manner as that of the first pixels SP1, and thus, redundant description thereof will not be repeated.

Figure 12:
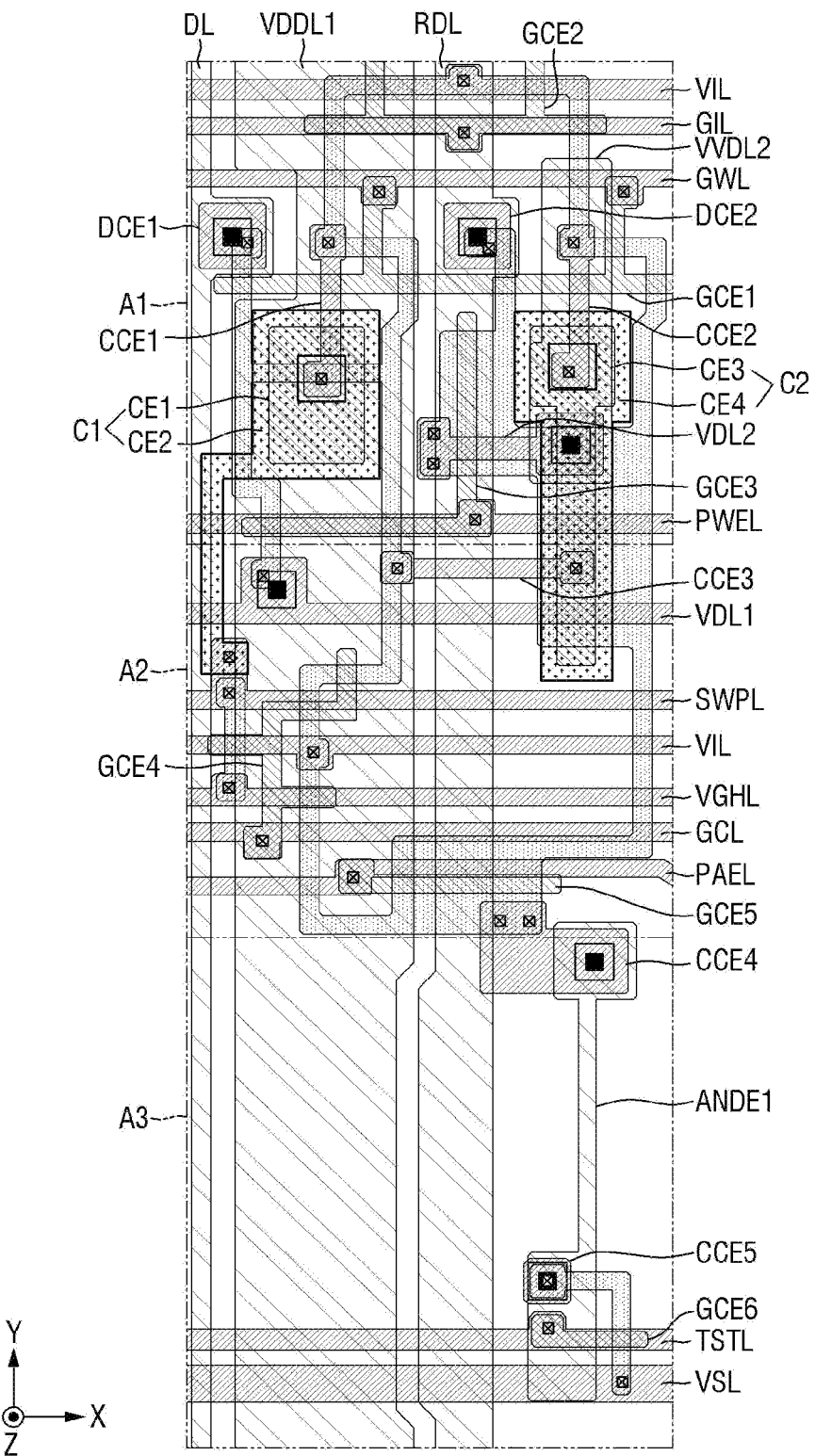
FIG. 12 is a layout view of the pixel of FIG. 3.
Figure 13:
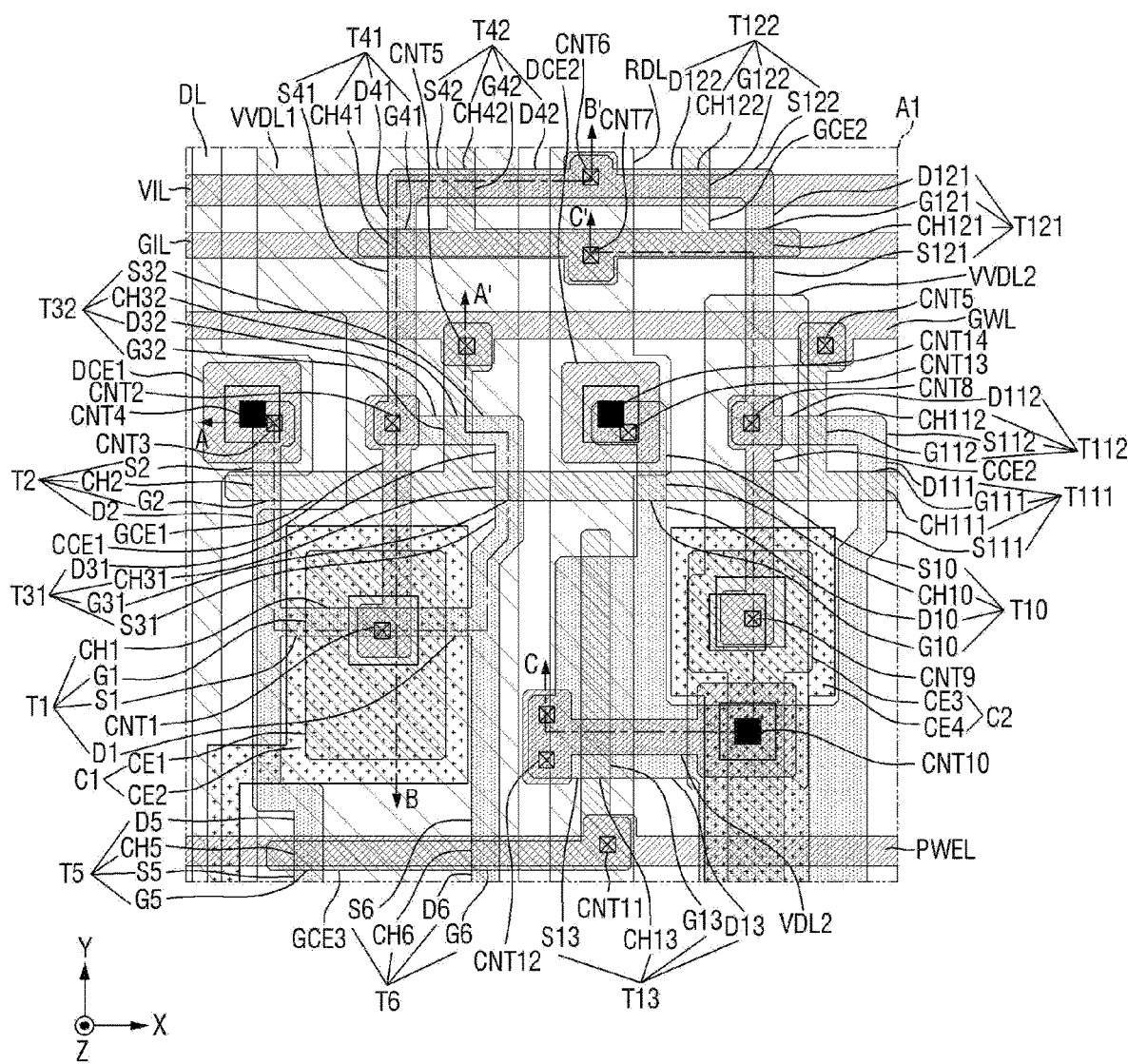
FIG. 13 is an enlarged layout view of the area A1 of FIG. 12.
Figure 14:
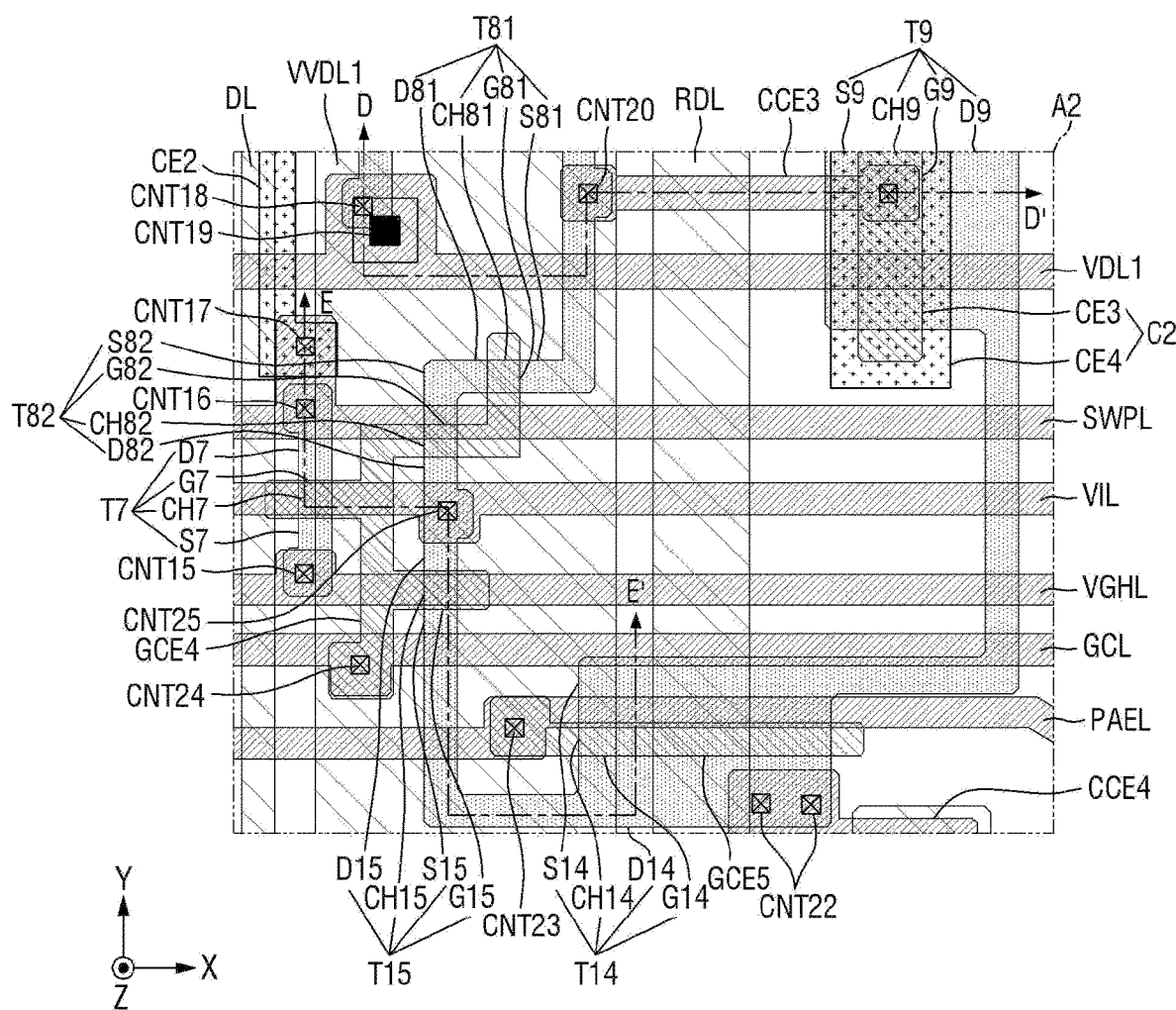
FIG. 14 is an enlarged layout view of the area A2 of FIG. 12.
Figure 15:
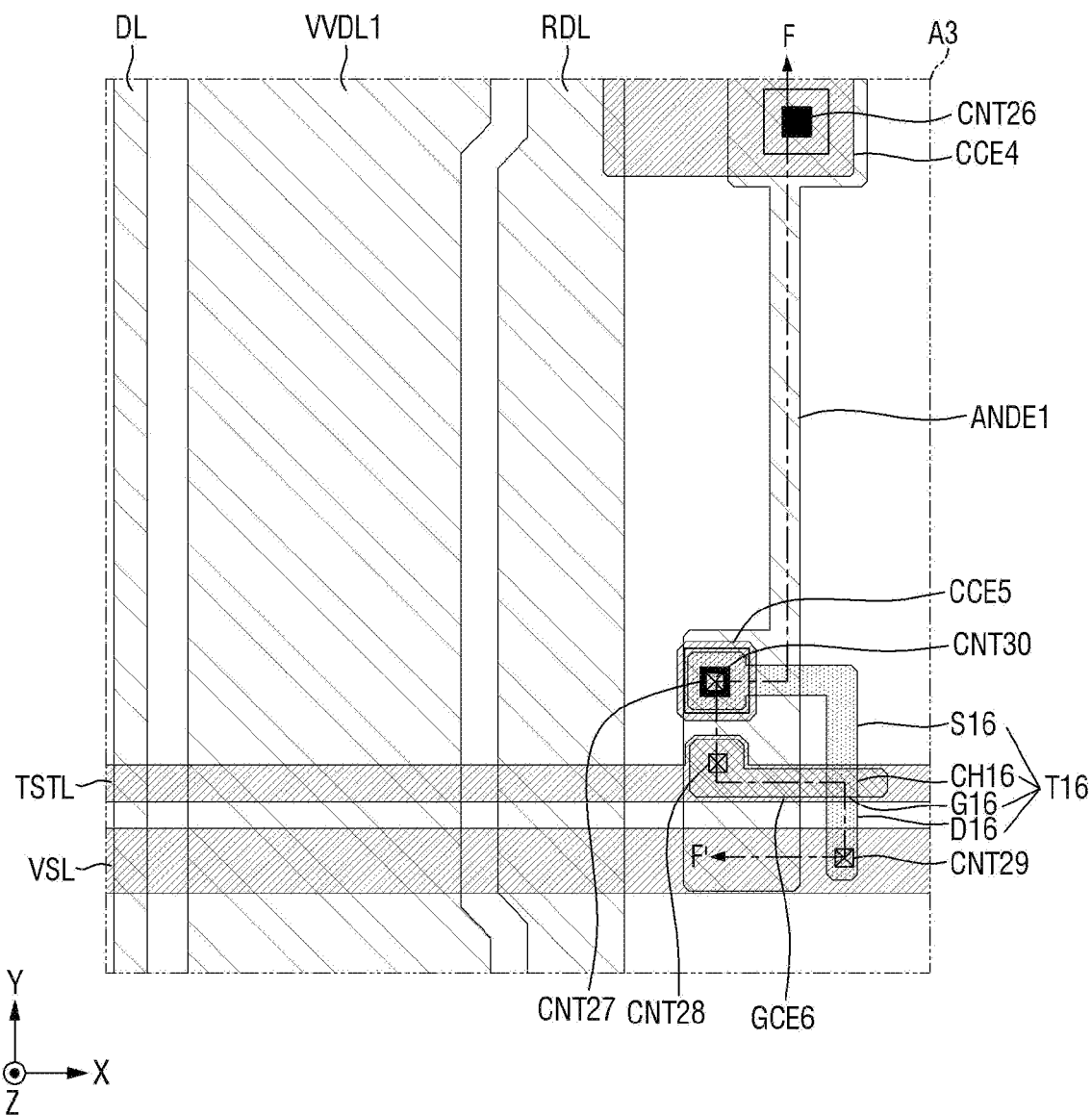
FIG. 15 is an enlarged layout view of the area A3 of FIG. 12.
Figure 16:
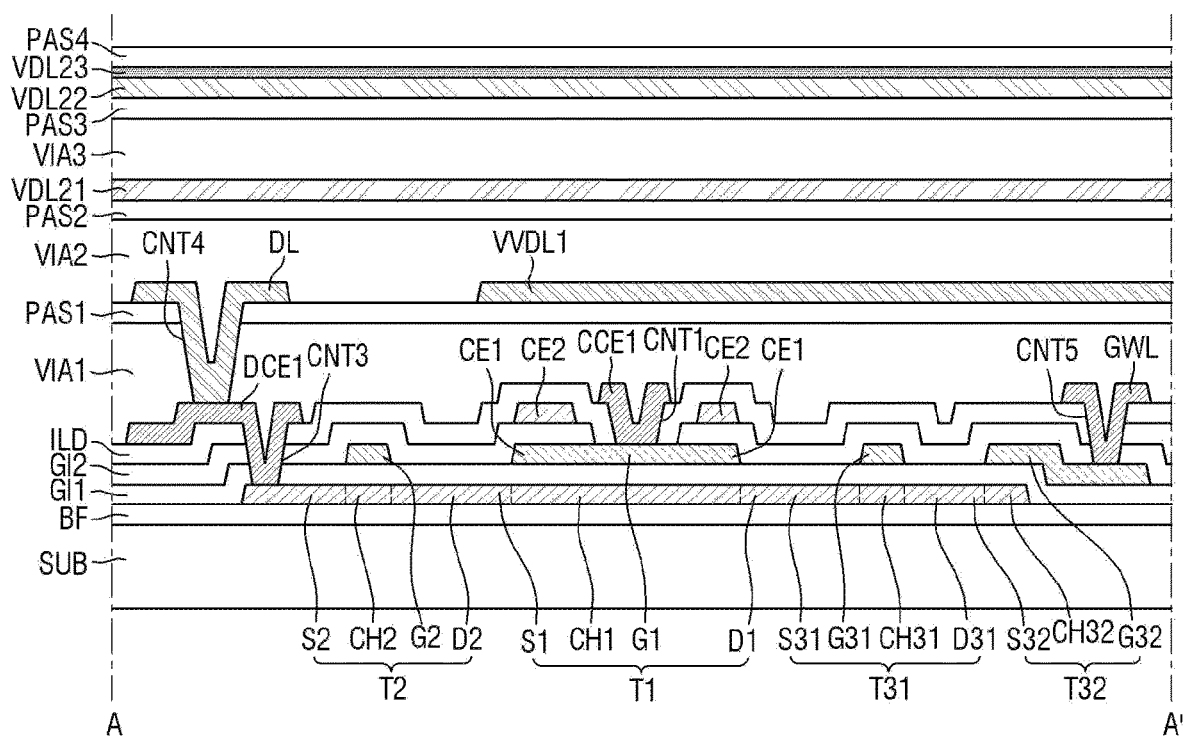
FIG. 16 is a cross-sectional view taken along the line A-A' of FIG. 13.
Figure 17:
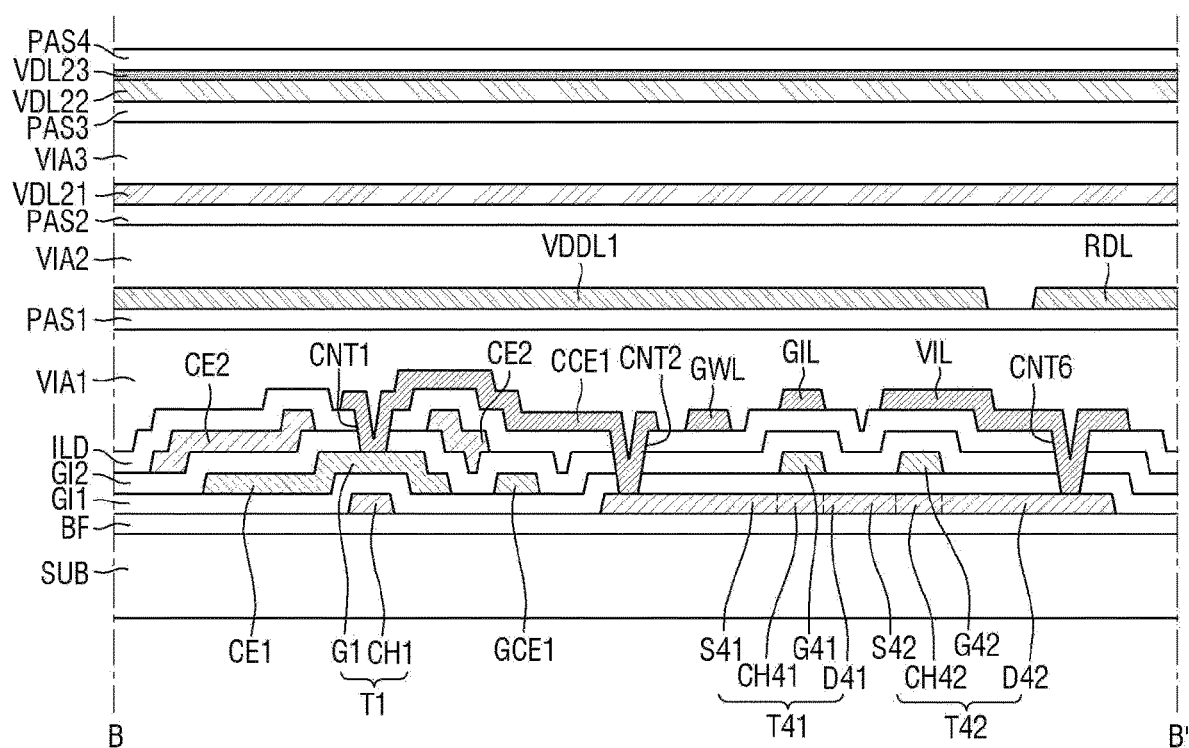
FIG. 17 is a cross-sectional view taken along the line B-B' of FIG. 13.
Figure 18:
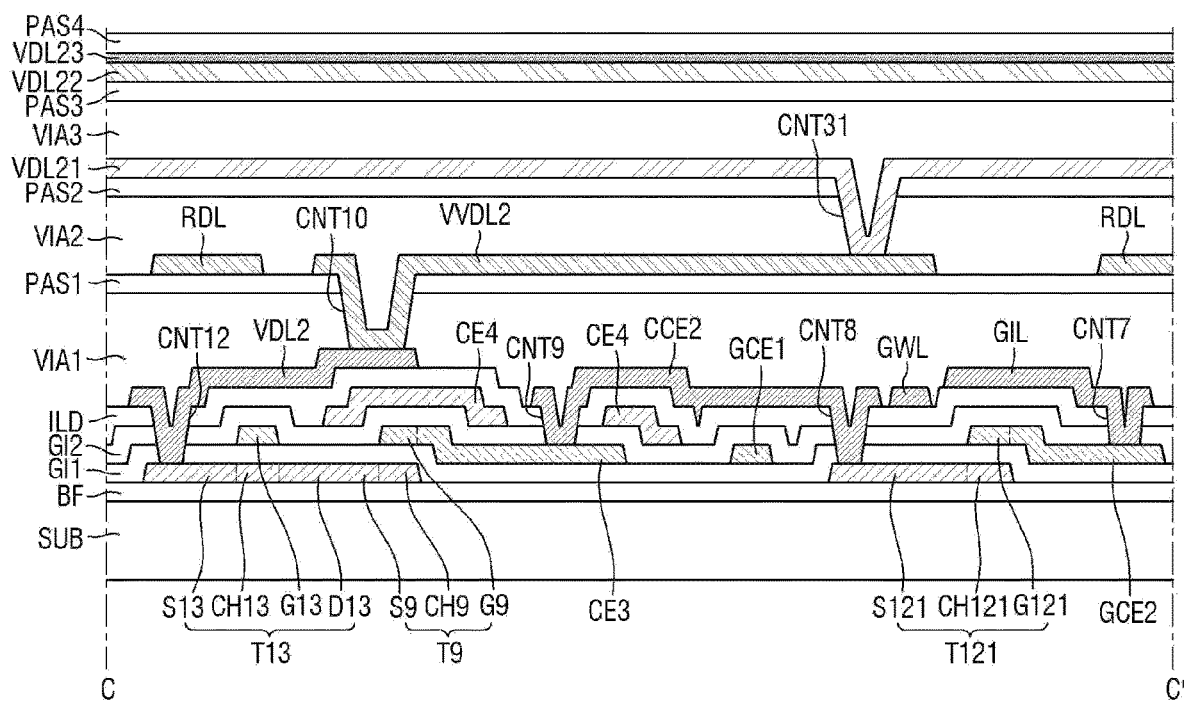
FIG. 18 is a cross-sectional view taken along the line C-C' of FIG. 13.
Figure 19:
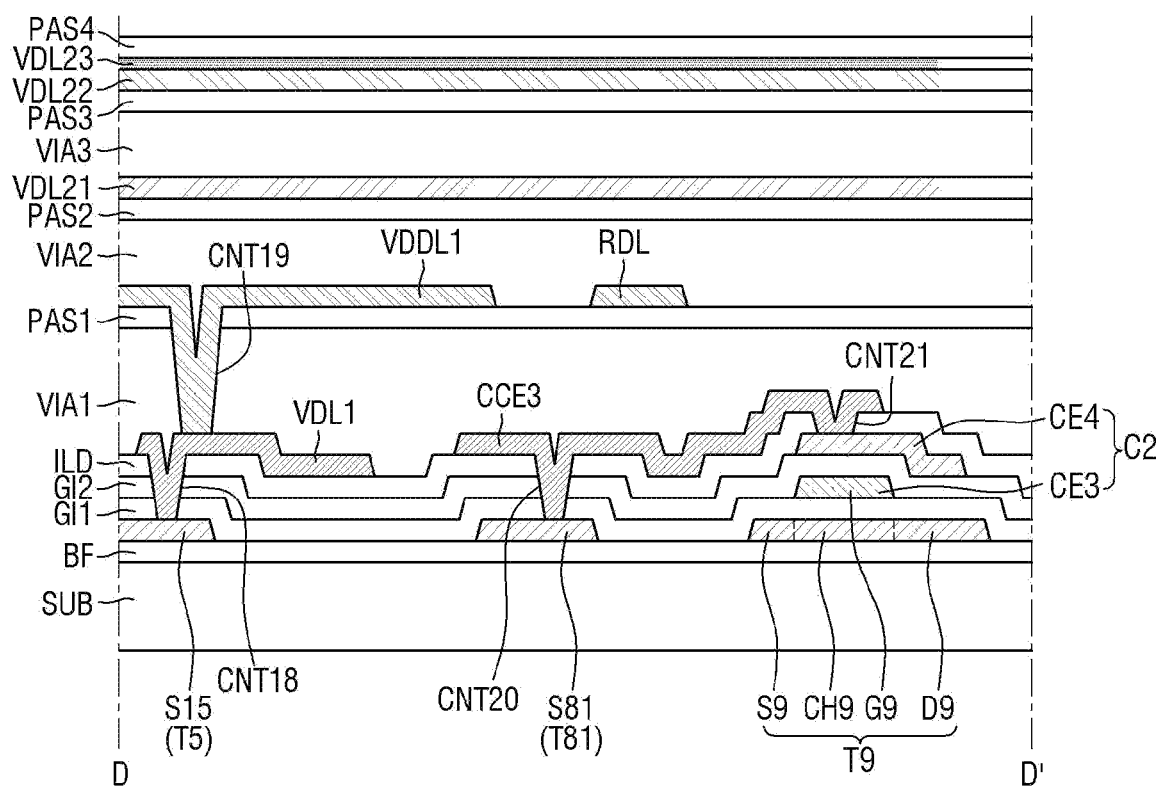
FIG. 19 is a cross-sectional view taken along the line D-D' of FIG. 14.
Figure 20:
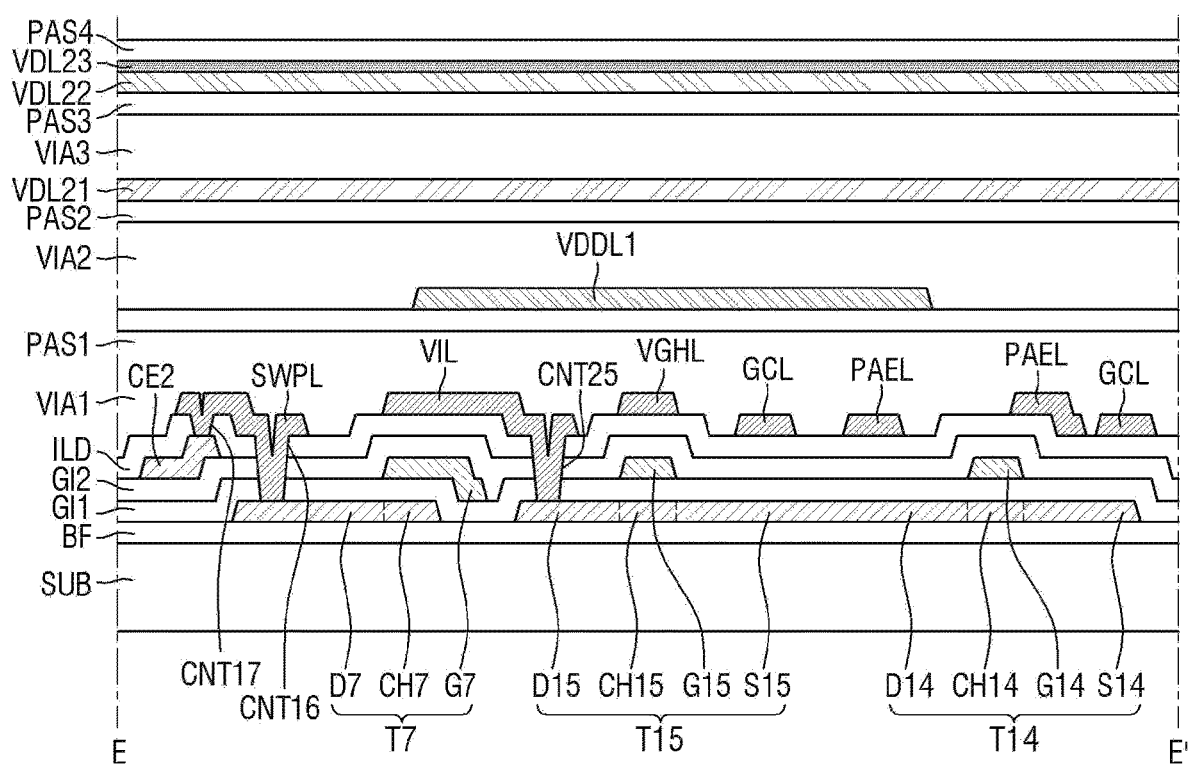
FIG. 20 is a cross-sectional view taken along the line E-E' of FIG. 14.
Figure 21:
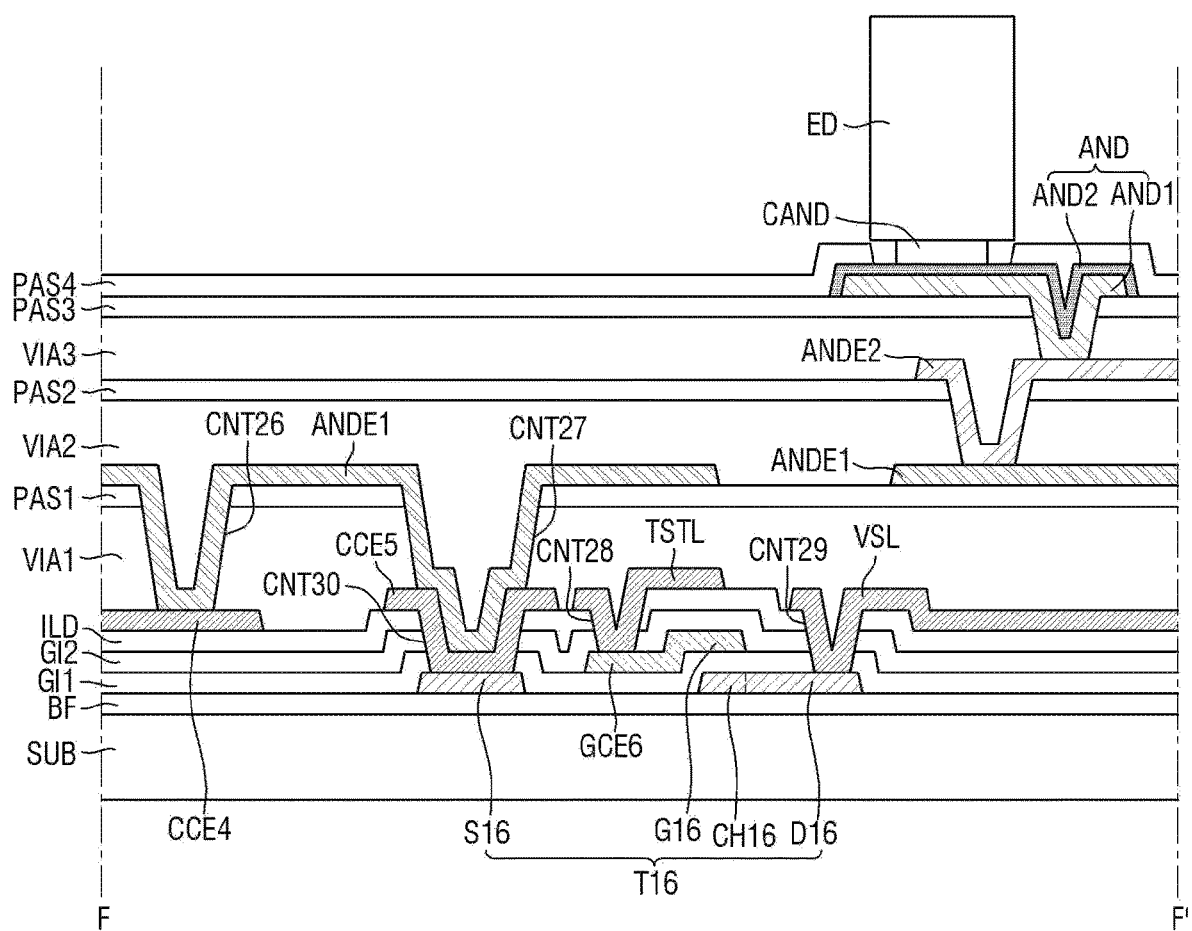
FIG. 21 is a cross-sectional view taken along line F-F' of FIG. 15.

FIG. 12 is a layout view of the pixel of FIG. 3. FIG. 13 is an enlarged layout view of the area A1 of FIG. 12. FIG. 14 is an enlarged layout view of the area A2 of FIG. 12. FIG. 15 is an enlarged layout view of the area A3 of FIG. 12. FIG. 16 is a cross-sectional view taken along the line A-A' of FIG. 13. FIG. 17 is a cross-sectional view taken along the line B-B' of FIG. 13. FIG. 18 is a cross-sectional view taken along the line C-C' of FIG. 13. FIG. 19 is a cross-sectional view taken along the line D-D' of FIG. 14. FIG. 20 is a cross-sectional view taken along the line E-E' of FIG. 14. FIG. 21 is a cross-sectional view taken along the line F-F' of FIG. 15.

Referring to FIGS. 12 through 21, the scan initialization line GIL, the scan write line GWL, the scan control line GCL, the sweep line SWPL, the PWM emission line PWEL, the PAM emission line PAEL, the test signal line TSTL, and the third power supply line VSL may extend in the first direction (e.g., the X-axis direction), and may be spaced apart from one another in the second direction (e.g., the Y-axis direction).

The data line DL, a first vertical power supply line VVDL1, a second vertical power supply line VVDL2, and the first PAM data line RDL may extend in the second direction (e.g., the Y-axis direction), and may be spaced apart from one another in the first direction (e.g., the X-axis direction).

The pixel SP may include the first through sixteenth transistors T1 through T16, the first and second capacitors C1 and C2, first through sixth gate connecting electrodes GCE1 through GCE6, first and second data connecting electrodes DCE1 and DCE2, first through fifth connecting electrodes CCE1 through CCE5, first and second anode connecting electrodes ANDE1 and ANDE2, and the light-emitting element ED.

The first transistor T1 may include a first channel CH1, a first gate electrode G1, a first source electrode S1, and a first drain electrode D1. The first channel CH1 may extend in the first direction (e.g., the X-axis direction). The first channel CH1 may overlap with the first gate electrode G1 in the third direction (e.g., the Z-axis direction). The first gate electrode G1 may be connected to the first connecting electrode CCE1 through a first contact hole CNT1. The first gate electrode G1 may be integrally formed with a first capacitor electrode CE1 of the first capacitor C1. The first gate electrode G1 may overlap with a second capacitor electrode CE2 of the first capacitor C1 in the third direction (e.g., the Z-axis direction). The first source electrode S1 may be disposed on one side of the first channel CH1, and the first drain electrode D1 may be disposed on another side of the first channel CH1. The first source electrode S1 may be connected to the second and fifth drain electrodes D2 and D5. The first drain electrode D1 may be connected to a (3-1)-th source electrode S31 and a sixth source electrode S6.

The second transistor T2 may include a second channel CH2, a second gate electrode G2, a second source electrode S2, and a second drain electrode D2. The second channel CH2 may overlap with the second gate electrode G2 in the third direction (e.g., the Z-axis direction). The second gate electrode G2 may be part of the first gate connecting electrode GCE1. The second source electrode S2 may be disposed on one side of the second channel CH2, and the second drain electrode D2 may be disposed on another side of the second channel CH2. The second source electrode S2 may be connected to the first data connecting electrode DCE1 through a third contact hole CNT3. The second drain electrode D2 may be connected to the first source electrode S1 and the fifth drain electrode D5.

The (3-1)-th transistor T31 of the third transistor T3 may include a (3-1)-th channel CH31, a (3-1)-th gate electrode G31, a (3-1)-th source electrode S31, and a (3-1)-th drain electrode D31. The (3-1)-th channel CH31 may overlap with the (3-1)-th gate electrode G31 in the third direction (e.g., the Z-axis direction). The (3-1)-th gate electrode G31 may be part of the first gate connecting electrode GCE1. The (3-1)-th source electrode S31 may be disposed on one side of the (3-1)-th channel CH31, and the (3-1)-th drain electrode D31 may be disposed on another side of the (3-1)-th channel CH31. The (3-1)-th source electrode S31 may be connected to the first drain electrode D1 and the sixth source electrode S6. The (3-1)-th drain electrode D31 may be connected to a (3-2)-th source electrode S32.

The (3-2)-th transistor T32 of the third transistor T3 may include a (3-2)-th channel CH32, a (3-2)-th gate electrode G32, the (3-2)-th source electrode S32, and a (3-2)-th drain electrode D32. The (3-2)-th channel CH32 may overlap with the (3-2)-th gate electrode G32 in the third direction (e.g., the Z-axis direction). The (3-2)-th gate electrode G32 may be part of the first gate connecting electrode GCE1. The (3-2)-th source electrode S32 may be disposed on one side of the (3-2)-th channel CH32, and the (3-2)-th drain electrode D32 may be disposed on another side of the (3-2)-th channel CH32. The (3-2)-th source electrode S32 may be connected to the (3-1)-th drain electrode D31. The (3-2)-th drain electrode D32 may be connected to the first connecting electrode CCE1 through a second contact hole CNT2, and may also be connected to a (4-1)-th source electrode S41.

The (4-1)-th transistor T41 of the fourth transistor T4 may include a (4-1)-th channel CH41, a (4-1)-th gate electrode G41, the (4-1)-th source electrode S41, and a (4-1)-th drain electrode D41. The (4-1)-th channel CH41 may overlap with the (4-1)-th gate electrode G41 in the third direction (e.g., the Z-axis direction). The (4-1)-th gate electrode G41 may be part of the second gate connecting electrode GCE2. The (4-1)-th source electrode S41 may be disposed on one side of the (4-1)-th channel CH41, and the (4-1)-th drain electrode D41 may be disposed on another side of the (4-1)-th channel CH41. The (4-1)-th source electrode S41 may be connected to the first connecting electrode CCE1 through the second contact hole CNT2, and may also be connected to the (3-2)-th drain electrode D32. The (4-1)-th drain electrode D41 may be connected to a (4-2)-th source electrode S42. The (4-1)-th source electrode S41 may overlap with the scan write line GWL in the third direction (e.g., the Z-axis direction). The (4-1)-th drain electrode D41 may overlap with the initialization voltage line VIL in the third direction (e.g., the Z-axis direction).

The (4-2)-th transistor T42 of the fourth transistor T4 may include a (4-2)-th channel CH42, a (4-2)-th gate electrode G42, the (4-2)-th source electrode S42, and a (4-2)-th drain electrode D42. The (4-2)-th channel CH42 may overlap with the (4-2)-th gate electrode G42 in the third direction (e.g., the Z-axis direction). The (4-2)-th gate electrode G42 may be part of the second gate connecting electrode GCE2. The (4-2)-th source electrode S42 may be disposed on one side of the (4-2)-th channel CH42, and the (4-2)-th drain electrode D42 may be disposed on another side of the (4-2)-th channel CH42. The (4-2)-th source electrode S42 may be connected to the (4-1)-th drain electrode D41, and may also be connected to the initialization voltage line VIL through a sixth contact hole CNT6. The (4-2)-th source electrode S42 and the (4-2)-th drain electrode D42 may overlap with the initialization voltage line VIL in the third direction (e.g., the Z-axis direction).

The fifth transistor T5 may include a fifth channel CH5, a fifth gate electrode G5, a fifth source electrode S5, and a fifth drain electrode D5. The fifth channel CH5 may overlap with the fifth gate electrode G5 in the third direction (e.g., the Z-axis direction). The first gate electrode G5 may be part of the third gate connecting electrode GCE3. The fifth source electrode S5 may be disposed on one side of the fifth channel CH5, and the fifth drain electrode D5 may be disposed on another side of the fifth channel CH5. The fifth source electrode S5 may be connected to the first power supply line VDL1 through an eighteenth contact hole CNT18. The fifth drain electrode D5 may be connected to the first source electrode S1 and the second drain electrode D2. The fifth drain electrode D5 may overlap with an extension part of the second capacitor electrode CE2 in the third direction (e.g., the Z-axis direction).

The sixth transistor T6 may include a sixth channel CH6, a sixth gate electrode G6, a sixth source electrode S6, and a sixth drain electrode D6. The sixth channel CH6 may overlap with the sixth gate electrode G6 in the third direction (e.g., the Z-axis direction). The sixth gate electrode G6 may be part of the third gate connecting electrode GCE3. The sixth source electrode S6 may be disposed on one side of the sixth channel CH6, and the sixth drain electrode D6 may be disposed on another side of the sixth channel CH6. The sixth source electrode S6 may be connected to the first drain electrode D1 and the (3-1)-th source electrode S31. The sixth drain electrode D6 may be connected to the third connecting electrode CCE3 through a twentieth contact hole CNT20, and may also be connected to an (8-1)-th source electrode S81. The sixth drain electrode D6 may overlap with the first power supply line VDL1 in the third direction (e.g., the Z-axis direction).

The seventh transistor T7 may include a seventh channel CH7, a seventh gate electrode G7, a seventh source electrode S7, and a seventh drain electrode D7. The seventh channel CH7 may overlap with the seventh gate electrode G7 in the third direction (e.g., the Z-axis direction). The seventh gate electrode G7 may be part of the fourth gate connecting electrode GCE4. The seventh gate electrode G7 may overlap with the initialization voltage line VIL in the third direction (e.g., the Z-axis direction). The seventh source electrode S7 may be disposed on one side of the seventh channel CH7, and the seventh drain electrode D7 may be disposed on another side of the seventh channel CH7. The seventh source electrode S7 may be connected to the gate-off voltage line VGHL through a fifteenth contact hole CNT15. The seventh drain electrode D7 may be connected to the sweep line SWPL through a sixteenth contact hole CNT16.

The (8-1)-th transistor T81 of the eighth transistor T8 may include an (8-1)-th channel CH81, an (8-1)-th gate electrode G81, an (8-1)-th source electrode S81, and an (8-1)-th drain electrode D81. The (8-1)-th channel CH81 may overlap with the (8-1)-th gate electrode G81 in the third direction (e.g., the Z-axis direction). The (8-1)-th source electrode S81 may be part of the fourth gate connecting electrode GCE4. The (8-1)-th source electrode S81 may be disposed on one side of the (8-1)-th channel CH81, and the (8-1)-th drain electrode D81 may be disposed on another side of the (8-1)-th channel CH81. The (8-1)-th source electrode S81 may be connected to the sixth drain electrode D6, and may also be connected to the third connecting electrode CCE3 through the twentieth contact hole CNT20. The (8-1)-th drain electrode D81 may be connected to a (8-2)-th source electrode S82.

The (8-2)-th transistor T82 of the eighth transistor T8 may include an (8-2)-th channel CH82, an (8-2)-th gate electrode G82, the (8-2)-th source electrode S82, and an (8-2)-th drain electrode D82. The (8-2)-th channel CH82 may overlap with the (8-2)-th gate electrode G82 in the third direction (e.g., the Z-axis direction). The (8-2)-th source electrode S82 may be part of the fourth gate connecting electrode GCE4. The (8-2)-th source electrode S82 may be disposed on one side of the (8-2)-th channel CH82, and the (8-2)-th drain electrode D82 may be disposed on another side of the (8-2)-th channel CH82. The (8-2)-th source electrode S82 may be connected to the (8-1)-th drain electrode D81, and the (8-2)-th drain electrode D82 may be connected to the initialization voltage line VIL through a twenty-fifth contact hole CNT25.

The ninth transistor T9 may include a ninth channel CH9, a ninth gate electrode G9, a ninth source electrode S9, and a ninth drain electrode D9. The ninth channel CH9 may overlap with the ninth gate electrode G9 in the third direction (e.g., the Z-axis direction). The ninth gate electrode G9 may extend in the second direction (e.g., the Y-axis direction). The ninth gate electrode G9 may be integrally formed with the first capacitor electrode CE3 of the second capacitor C2. The ninth source electrode S9 may be disposed on one side of the ninth channel CH9, and the ninth drain electrode D9 may be disposed on another side of the ninth channel CH9. The ninth source electrode S9 may be connected to the tenth and thirteenth drain electrodes D10 and D13. The ninth drain electrode D9 may be connected to a (11-1)-th source electrode S111 and the fourteenth source electrode S14.

The tenth transistor T10 may include a tenth channel CH10, a tenth gate electrode G10, a tenth source electrode S10, and a tenth drain electrode D10. The tenth channel CH10 may overlap with the tenth gate electrode G10 in the third direction (e.g., the Z-axis direction). The tenth gate electrode G10 may be part of the first gate connecting electrode GCE1. The tenth source electrode S10 may be disposed on one side of the tenth channel CH10, and the tenth drain electrode D10 may be disposed on another side of the tenth channel CH10. The tenth source electrode 510 may be connected to the second data connecting electrode DCE2 through a thirteenth contact hole CNT13. The tenth drain electrode D10 may be connected to the ninth source electrode D9 and the thirteenth drain electrode D13.

The (11-1)-th transistor T111 of the eleventh transistor T11 may include a (11-1)-th channel CH111, a (11-1)-th gate electrode G111, a (11-1)-th source electrode S111, and a (11-1)-th drain electrode D111. The (11-1)-th channel CH111 may overlap with the (11-1)-th gate electrode G111 in the third direction (e.g., the Z-axis direction). The (11-1)-th gate electrode G111 may be part of the first gate connecting electrode GCE1. The (11-1)-th source electrode S111 may be disposed on one side of the (11-1)-th channel CH111, and the (11-1)-th drain electrode D111 may be disposed on another side of the (11-1)-th channel CH111. The (11-1)-th source electrode S111 may be connected to the ninth drain electrode D9 and the fourteenth source electrode S14, and the (11-1)-th drain electrode D111 may be connected to a (11-2)-th source electrode S112.

The (11-2)-th transistor T112 of the eleventh transistor T11 may include a (11-2)-th channel CH112, a (11-2)-th gate electrode G112, the (11-2)-th source electrode S112, and a (11-2)-th drain electrode D112. The (11-2)-th channel CH112 may overlap with the (11-2)-th gate electrode G112 in the third direction (e.g., the Z-axis direction). The (11-2)-th gate electrode G112 may be part of the first gate connecting electrode GCE1. The (11-2)-th source electrode S112 may be disposed on one side of the (11-2)-th channel CH112, and the (11-2)-th drain electrode D112 may be disposed on another side of the (11-2)-th channel CH112. The (11-2)-th source electrode S112 may be connected to the (11-1)-th drain electrode D111. The (11-2)-th drain electrode D112 may be connected to a (12-1)-th source electrode S121, and may also be connected to the second connecting electrode CCE2 through an eighth contact hole CNT8.

The (12-1)-th transistor T121 of the twelfth transistor T12 may include a (12-1)-th channel CH121, a (12-1)-th gate electrode G121, the (12-1)-th source electrode S121, and a (12-1)-th drain electrode D121. The (12-1)-th channel CH121 may overlap with the (12-1)-th gate electrode G121 in the third direction (e.g., the Z-axis direction). The (12-1)-th gate electrode G121 may be part of the second gate connecting electrode GCE2. The (12-1)-th source electrode S121 may be disposed on one side of the (12-1)-th channel CH121, and the (12-1)-th drain electrode D121 may be disposed on another side of the (12-1)-th channel CH121. The (12-1)-th source electrode S121 may be connected to the (11-2)-th drain electrode D112, and may also be connected to the second connecting electrode CCE2 through the eighth contact hole CNT8. The (12-1)-th drain electrode D121 may be connected to a (12-2)-th source electrode S122.

The (12-2)-th transistor T122 of the twelfth transistor T12 may include a (12-2)-th channel CH122, a (12-2)-th gate electrode G122, the (12-2)-th source electrode S122, and a (12-2)-th drain electrode D122. The (12-2)-th channel CH122 may overlap with the (12-2)-th gate electrode G122 in the third direction (e.g., the Z-axis direction). The (12-2)-th gate electrode G122 may be part of the second gate connecting electrode GCE2. The (12-2)-th source electrode S122 may be disposed on one side of the (12-2)-th channel CH122, and the (12-2)-th drain electrode D122 may be disposed on another side of the (12-2)-th channel CH122. The (12-2)-th source electrode S122 may be connected to the (12-1)-th drain electrode D121, and may also be connected to the initialization voltage line VIL through the sixth contact hole CNT6. The (12-2)-th source electrode S122 and the (12-2)-th drain electrode D122 may overlap with the initialization voltage line VIL in the third direction (e.g., the Z-axis direction).

The thirteenth transistor T13 may include a thirteenth channel CH13, a thirteenth gate electrode G13, a thirteenth source electrode S13, and a thirteenth drain electrode D13. The thirteenth channel CH13 may overlap with the thirteenth gate electrode G13 in the third direction (e.g., the Z-axis direction). The thirteenth gate electrode G13 may be part of the third gate connecting electrode GCE3. The thirteenth source electrode S13 may be disposed on one side of the thirteenth channel CH13, and the thirteenth drain electrode D13 may be disposed on another side of the thirteenth channel CH13. The thirteenth source electrode S13 may be connected to the second power supply line VDL2 through a twelfth contact hole CNT12. The thirteenth drain electrode D13 may be connected to the ninth source electrode S9 and the tenth drain electrode D10.

The fourteenth transistor T14 may include a fourteenth channel CH14, a fourteenth gate electrode G14, a fourteenth source electrode S14, and a fourteenth drain electrode D14. The fourteenth channel CH14 may overlap with the fourteenth gate electrode G14 in the third direction (e.g., the Z-axis direction). The fourteenth gate electrode G14 may be part of the fifth gate connecting electrode GCES. The fourteenth source electrode S14 may be disposed on one side of the fourteenth channel CH14, and the fourteenth drain electrode D14 may be disposed on another side of the fourteenth channel CH14. The fourteenth source electrode S14 may be connected to the ninth drain electrode D9 and the (11-1)-th source electrode S111. The fourteenth drain electrode D14 may be connected to the fourth connecting electrode CCE4 through a twenty-second contact hole CNT22.

The fifteenth transistor T15 may include a fifteenth channel CH15, a fifteenth gate electrode G15, a fifteenth source electrode S15, and a fifteenth drain electrode D15. The fifteenth channel CH15 may overlap with the fifteenth gate electrode G15 in the third direction (e.g., the Z-axis direction). The fifteenth gate electrode G15 may be part of the fourth gate connecting electrode CCE4. The fifteenth source electrode S15 may be disposed on one side of the fifteenth channel CH15, and the fifteenth drain electrode D15 may be disposed on another side of the fifteenth channel CH15. The fifteenth source electrode S15 may be connected to the fourteenth drain electrode D14, and may also be connected to the fourth connecting electrode CCE4 through the twenty-second contact hole CNT22. The fifteenth drain electrode D15 may be connected to the initialization voltage line VIL through the twenty-fifth contact hole CNT25.

The sixteenth transistor T16 may include a sixteenth channel CH16, a sixteenth gate electrode G16, a sixteenth source electrode S16, and a sixteenth drain electrode D16. The sixteenth channel CH16 may overlap with the sixteenth gate electrode G16 in the third direction (e.g., the Z-axis direction). The sixteenth gate electrode G16 may be part of the sixth gate connecting electrode GCE6. The sixteenth source electrode S16 may be disposed on one side of the sixteenth channel CH16, and the sixteenth drain electrode D16 may be disposed on another side of the sixteenth channel CH16. The sixteenth source electrode S16 may be connected to the fifth connecting electrode CCES through a thirtieth contact hole CNT30. The sixteenth drain electrode D16 may be connected to the third power supply line VSL through a twenty-ninth contact hole CNT29.

The first capacitor electrode CE1 of the first capacitor C1 may be integrally formed with the first gate electrode G1. The second capacitor electrode CE2 of the first capacitor C1 may overlap with the first capacitor electrode CE1 of the first capacitor C1 in the third direction (e.g., the Z-axis direction). The second capacitor electrode CE2 may include a hole exposing the first gate electrode G1, and the first connecting electrode CCE may be connected to the first gate electrode G1 through the first contact hole CNT1, which penetrates the hole of the second capacitor electrode CE2.

The second capacitor electrode CE2 of the first capacitor C1 may include an extension part extending in the second direction (e.g., the Y-axis direction. The extension part of the second capacitor electrode CE2 may cross (e.g., may intersect) the PWM emission line PWEL and the first power supply line VDL1. The extension part of the second capacitor CE2 may be connected to the sweep line SWPL through a seventeenth contact hole CNT17.

The first capacitor electrode CE3 of the second capacitor C2 may be integrally formed with the ninth gate electrode G9. A second capacitor electrode CE4 of the second capacitor C2 may overlap with the first capacitor electrode CE3 of the second capacitor C2 in the third direction (e.g., the Z-axis direction). The second capacitor electrode CE4 may include a hole exposing the ninth gate electrode G9, and the second connecting electrode CCE2 may be connected to the ninth gate electrode G9 through a ninth contact hole CNT9, which penetrates the hole of the second capacitor electrode CE4.

The first gate connecting electrode GCE1 may be connected to the scan write line GWL through a fifth contact hole CNTS. The second gate connecting electrode CCE2 may be connected to the scan initialization line GIL through a seventh contact hole CNT7. The third gate connecting electrode GCE3 may be connected to the PWM emission line PWEL through an eleventh contact hole CNT11. The fourth gate connecting electrode GCE4 may be connected to the scan control line GCL through a twenty-fourth contact hole CNT24. The fifth gate connecting electrode GCES may be connected to the PAM emission line PAEL through a twenty-third contact hole CNT23. The sixth gate connecting electrode GCE6 may be connected to the test signal line TSTL through a twenty-eighth contact hole CNT28.

The first data connecting electrode DCE1 may be connected to the second source electrode S2 through the third contact hole CNT3, and to the data line DL through the fourth contact hole CNT4. The second data connecting electrode DCE2 may be connected to the tenth source electrode S10 through the thirteenth contact hole CNT13, and to the first PAM data line RDL through the fourteenth contact hole CNT14.

The first connecting electrode CCE1 may extend in the second direction (e.g., the Y-axis direction). The first connecting electrode CCE1 may be connected to the first gate electrode G1 through the first contact hole CNT1, and to the (3-2)-th drain electrode D32 and the (4-1)-th source electrode S41 through the second contact hole CNT2.

The second connecting electrode CCE2 may extend in the second direction (e.g., the Y-axis direction). The second connecting electrode CCE2 may be connected to the ninth gate electrode G9 through the ninth contact hole CNT9, and to the (11-2)-th drain electrode D112 and the (12-1)-th source electrode S121 through the eighth contact hole CNT8.

The third connecting electrode CCE3 may be connected to the sixth drain electrode D6 and the (8-1)-th source electrode S81 through the twentieth contact hole CNT20, and to the second capacitor electrode CE4 of the second capacitor C2 through a twenty-first contact hole CNT21.

The fourth connecting electrode CCE4 may be connected to the fourteenth drain electrode D14 and the fifteenth source electrode S15 through the twenty-second contact hole CNT22, and to the first anode connecting electrode ANDE1 through a twenty-sixth contact hole CNT26.

The fifth connecting electrode CCES may be connected to the sixteenth source electrode S16 through the thirtieth contact hole CNT30, and to the first anode connecting electrode ANDE1 through a twenty-seventh contact hole CNT27. The first anode connecting electrode ANDE1 may extend in the second direction (e.g., the Y-axis direction).

The first vertical power supply line VVDL1 may extend in the second direction (e.g., the Y-axis direction). The first vertical power supply line VVDL1 may be connected to the first power supply line VDL1 through a nineteenth contact hole The second vertical power supply line VVDL2 may extend in the second direction (e.g., the Y-axis direction). The second vertical power supply line VVDL2 may be connected to the second power supply line VDL2 through a tenth contact hole CNT10.

Referring to FIGS. 16 through 21, the display device may include a substrate SUB, a buffer layer BF, a first gate insulating film GI1, a second gate insulating film GI2, an interlayer insulating film ILD, a first via layer VIA1, a first passivation layer PAS1, a second via layer VIA2, a second passivation layer PAS2, a third via layer VIA3, a third passivation layer PAS3, and a fourth passivation layer PAS4.

The substrate SUB may support the display device. The substrate SUB may be a base substrate or a base member. The substrate SUB may be a flexible substrate that is bendable, foldable, and/or rollable. For example, the substrate SUB may include an insulating material, such as a polymer resin (e.g., polyimide (PI)), but the present disclosure is not limited thereto. In another example, the substrate SUB may be a rigid substrate including a glass material.

The buffer layer BF may be disposed on the substrate SUB. The buffer layer BF may include an inorganic material capable of preventing or substantially preventing the infiltration of air and/or moisture. The buffer layer BF may include a single inorganic film, or a plurality of inorganic films that are sequentially (e.g., alternately) stacked. For example, the buffer layer BF may be a multilayered film in which one of a silicon nitride layer, a silicon oxynitride layer, a silicon oxide layer, a titanium oxide layer, and an aluminum oxide layer is alternately stacked.

An active layer may be disposed on the buffer layer BF. The active layer may include the first through sixteenth channels CH1 through CH16, the first through sixteenth source electrodes S1 through S16, and the first through sixteenth drain electrodes D1 through D16 of the first through sixteenth transistors T1 through T16. For example, the active layer may include polycrystalline silicon, monocrystalline silicon, low-temperature polycrystalline silicon, amorphous silicon, or an oxide semiconductor.

In another example, some of the first through sixteenth channels CH1 through CH16, some of the first through sixteenth source electrodes S1 through S16, and some of the first through sixteenth drain electrodes D1 through D16 may be disposed at (e.g., in or on) a first active layer including polycrystalline silicon, monocrystalline silicon, low-temperature polycrystalline silicon, or amorphous silicon, and the others of the first through sixteenth channels CH1 through CH16, the others of the first through sixteenth source electrodes S1 through S16, and the others of the first through sixteenth drain electrodes D1 through D16 may be disposed at (e.g., in or on) a second active layer including an oxide semiconductor.

The first through sixteenth channels CH1 through CH16 may overlap with the first through sixteenth gate electrodes G1 through G16, respectively, in the third direction (e.g., the Z-axis direction). The first through sixteenth source electrodes S1 through S16 and the first through sixteenth drain electrodes D1 through D16 may include a silicon semiconductor or an oxide semiconductor doped with ions or impurities, and thus, may have conductivity.

The first gate insulating film GI1 may be disposed on the active layer. The first gate insulating film GI1 may insulate the first through sixteenth channels CH1 through CH16 from the first through sixteenth gate electrodes G1 through G16, respectively. The first gate insulating film GI1 may include an inorganic film. For example, the first gate insulating film GI1 may include at least one of a silicon nitride layer, a silicon oxynitride layer, a silicon oxide layer, a titanium oxide layer, and an aluminum oxide layer.

A first gate layer may be disposed on the first gate insulating film GI1. The first gate layer may include the first through sixteenth gate electrodes G1 through G16, the first capacitor electrode CE1 of the first capacitor C1, the first capacitor electrode CE3 of the second capacitor C2, and the first through sixth gate connecting electrodes GCE1 through GCE6.

The second gate insulating film GI2 may be disposed on the first gate layer. The second gate insulating film GI2 may insulate the first gate layer and a second gate layer from each other. The second gate insulating film GI2 may include an inorganic film. For example, the second gate insulating film GI2 may include at least one of a silicon nitride layer, a silicon oxynitride layer, a silicon oxide layer, a titanium oxide layer, and an aluminum oxide layer.

The second gate layer may be disposed on the second gate insulating film GI2. The second gate layer may include the second capacitor electrode CE2 of the first capacitor C1 and the second capacitor electrode CE4 of the second capacitor C2.

The interlayer insulating film ILD may be disposed on the second gate layer. The interlayer insulating film ILD may insulate a first source metal layer and the second gate layer from each other. The interlayer insulating film ILD may include an inorganic film. For example, the interlayer insulating film ILD may include at least one of a silicon nitride layer, a silicon oxynitride layer, a silicon oxide layer, a titanium oxide layer, and an aluminum oxide layer.

The first source metal layer may be disposed on the interlayer insulating film ILD. The first source metal layer may include the initialization voltage line VIL, the scan initialization line GIL, the scan write line GWL, the scan control line GCL, the PWM emission line PWEL, the PAM emission line PAEL, the sweep line SWPL, the test signal line TSTL, the first power supply line VDL1, the gate-off voltage line VGHL, and the third power supply line VSL. The first source metal layer may include the first and second data connecting electrodes DCE1 and DCE2, and the first through fifth connecting electrodes CCE1 through CCE5.

The first via layer VIA1 may be disposed on the first source metal layer. The first via layer VIA1 may planarize or substantially planarize the top (e.g., a top surface) of the first source metal layer.

The first passivation layer PAS1 may be disposed on the first via layer VIA1 to protect the first source metal layer. The first passivation layer PAS1 may include an inorganic film. For example, the first passivation layer PAS1 may include at least one of a silicon nitride layer, a silicon oxynitride layer, a silicon oxide layer, a titanium oxide layer, and an aluminum oxide layer.

A second source metal layer may be disposed on the first passivation layer PAS1. The second source metal layer may include the data line DL, the first vertical power supply line VVDL1, the second vertical power supply line VVDL2, the first PAM data line RDL, and the first anode connecting electrode ANDE1.

The second via layer VIA2 may be disposed on the second source metal layer. The second via layer VIA2 may planarize or substantially planarize the top (e.g., a top surface) of the second source metal layer.

The second passivation layer PAS2 may be disposed on the second via layer VIA2 to protect the second source metal layer. The second passivation layer PAS2 may include an inorganic film. For example, the second passivation layer PAS2 may include at least one of a silicon nitride layer, a silicon oxynitride layer, a silicon oxide layer, a titanium oxide layer, and an aluminum oxide layer.

A third source metal layer may be disposed on the second passivation layer PAS2. The third source metal layer may include a first sub-power supply line VDL21. The first sub-power supply line VDL21 may be connected to the second vertical power supply line VVDL2 through a thirty-first contact hole CNT31, which penetrates the second passivation layer PAS2 and the second via layer VIA2.

The third via layer VIA3 may be disposed on the third source metal layer. The third via layer VIA3 may planarize the top (e.g., a top surface) of the third source metal layer.

The third passivation layer PAS3 may be disposed on the third via layer VIA3 to protect the third source metal layer. The third passivation layer PAS3 may include an inorganic film. For example, the third passivation layer PAS3 may include one of a silicon nitride layer, a silicon oxynitride layer, a silicon oxide layer, a titanium oxide layer, and an aluminum oxide layer.

A fourth source metal layer may be disposed on the third passivation layer PAS3. The fourth source metal layer may include a second sub-power supply line VDL22 and a first pixel electrode AND1.

An anode layer may be disposed on the fourth source metal layer. The anode layer may include a third sub-power supply line VDL23 and a second pixel electrode AND2. The third sub-power supply line VDL23 and the second pixel electrode AND2 may include a transparent metallic material, for example, such as a transparent conductive oxide (TCO) (e.g., indium tin oxide (ITO) or indium zinc oxide (IZO)).

The fourth passivation layer PAS4 may be disposed on the anode layer. The fourth passivation layer PAS4 may include an inorganic film. For example, the fourth passivation layer PAS4 may include at least one of a silicon nitride layer, a silicon oxynitride layer, a silicon oxide layer, a titanium oxide layer, and an aluminum oxide layer. The fourth passivation layer PAS4 may not cover part of a top surface of a pixel electrode AND (e.g., the second pixel electrode AND2), and may expose part of the top surface of the pixel electrode AND.

The light-emitting element ED may be disposed on part of the pixel electrode AND that is not covered by the fourth passivation layer PAS4. A contact electrode CAND may be disposed between the light-emitting element ED and the pixel electrode AND, to electrically connect the light-emitting element ED and the pixel electrode AND to each other.

The light-emitting element ED may be an inorganic LED. The light-emitting element ED may include a first semiconductor layer, an electronic blocking layer, an active layer, a superlattice layer, and a second semiconductor layer, which are sequentially stacked.

The first semiconductor layer may be disposed on the contact electrode CAND. The first semiconductor layer may be doped with a dopant of a first conductivity type, for example, such as magnesium (Mg), zinc (Zn), calcium (Ca), selenium (Se), or barium (Ba). For example, the first semiconductor layer may be p-GaN doped with Mg, which is a p-type dopant.

The electron blocking layer may be disposed on the first semiconductor layer. The electron blocking layer may be a layer for suppressing or preventing too many electrons from flowing into the active layer. For example, the electron blocking layer may be p-AlGaN doped with Mg, which is a p-type dopant. However, the present disclosure is not limited thereto, and the electron blocking layer may not be provided.

The active layer may be disposed on the electron blocking layer. As electron-hole pairs combine in accordance with electric signals applied through the first and second semiconductor layers, the active layer may emit light.

The active layer may include a material of a single-quantum well structure or a multi-quantum well structure. In a case where the active layer includes a material of the multi-quantum well structure, the active layer may have a structure in which a plurality of well layers and a plurality of barrier layers are alternately stacked.

As another example, the active layer may have a structure where a semiconductor material with a large bandgap energy and a semiconductor material with a small bandgap energy are alternately stacked, or may include group-III to group-V semiconductor materials depending on a desired wavelength range of the light emitted by the active layer.

In a case where the active layer includes InGaN, the color of light emitted by the active layer may vary depending on the content of indium (In) in the active layer. For example, as the content of indium (In) of the active layer increases, the wavelength range of light emitted by the active layer may be switched to a red wavelength range, and as the content of indium (In) of the active layer decreases, the wavelength of light emitted by the active layer may be switched to a blue wavelength range. For example, the content of indium (In) of a light-emitting element ED of a third pixel SP3 may be about 15%, the content of indium (In) of a light-emitting element ED of a second pixel SP2 may be about 25%, and the content of indium (In) of a light-emitting element ED of a first pixel SP1 may be about 35% or greater. In other words, the light-emitting elements ED of the first, second, and third pixels SP1, SP2, and SP3 may be configured (e.g., may be made) to emit first-color light, second-color light, and third-color light, respectively, by controlling the content of indium (In) of the active layer.

The superlattice layer may be disposed on the active layer. The superlattice layer may be a layer for alleviating a stress between the second semiconductor layer and the active layer. For example, the superlattice layer may be formed of InGaN or GaN. However, the present disclosure is not limited thereto, and the superlattice layer may not be provided.

The second semiconductor layer may be disposed on the superlattice layer. The second semiconductor layer may be doped with a dopant of a second conductivity type, for example, such as silicon (Si), germanium (Ge), or tin (Sn). For example, the second semiconductor layer may be n-GaN doped with Si, which is an n-type dopant.

As described above, according to one or more embodiments of the present disclosure, a display device may be provided that is capable of minimizing or reducing luminance deviations, and improving the quality of an image by controlling a driving current applied to an inorganic light-emitting diode (LED). However, the present disclosure is not limited to the aspects and features set forth herein, and other aspects and features may be included as would be appreciated by those having ordinary skill in the art.

Although some embodiments have been described, those skilled in the art will readily appreciate that various modifications are possible in the embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific embodiments disclosed herein, and that various modifications to the disclosed embodiments, as well as other example embodiments, are intended to be included within the spirit and scope of the present disclosure as defined in the appended claims, and their equivalents.

What is claimed is:

1. A display device comprising:
   a first pixel driver connected to a scan write line, a sweep line, and a first data line, the first pixel driver being configured to generate a control current based on a first data voltage received from the first data line;
   a second pixel driver connected to the scan write line and a second data line, the second pixel driver being configured to generate a driving current based on a second data voltage received from the second data line, and control a period during which the driving current flows, based on the control current; and
   a light-emitting element connected to the second pixel driver to receive the driving current,
   wherein the first pixel driver comprises:
      a first transistor to generate the control current based on the first data voltage;
      a second transistor to provide the first data voltage to a first electrode of the first transistor based on a scan write signal received from the scan write line; and
      a first capacitor including a first capacitor electrode connected to a gate electrode of the first transistor, and a second capacitor electrode connected to the sweep line, and
   wherein the second pixel driver comprises:
      a third transistor to generate the driving current based on the control current;
      a fourth transistor to provide the second data voltage to a first electrode of the third transistor based on the scan write signal received from the scan write line; and
      a second capacitor including a first capacitor electrode connected to a gate electrode of the third transistor, and a second capacitor electrode to receive the control current.

2. The display device of claim 1, wherein a sweep signal of the sweep line has a pulse that linearly decreases from a gate-off voltage to a gate-on voltage.

3. The display device of claim 1, further comprising a scan initialization line and an initialization voltage line connected to the first pixel driver,
   wherein the first pixel driver further comprises:
      a fifth transistor to electrically connect a second electrode of the first transistor and the gate electrode of the first transistor to each other based on the scan write signal; and
      a sixth transistor to electrically connect the gate electrode of the first transistor and the initialization voltage line to each other based on a scan initialization signal received from the scan initialization line.

4. The display device of claim 3, wherein the fifth transistor comprises a plurality of transistors connected in series between the second electrode of the first transistor and the gate electrode of the first transistor.

5. The display device of claim 3, wherein the sixth transistor comprises a plurality of transistors connected in series between the gate electrode of the first transistor and the initialization voltage line.

6. The display device of claim 3, further comprising a pulse width modulation (PWM) emission line and a first power supply line connected to the first pixel driver,
   wherein the first pixel driver comprises:
      a seventh transistor to electrically connect the first power supply line and the first electrode of the first transistor to each other based on a PWM emission signal received from the PWM emission line; and
      an eighth transistor to electrically connect the second electrode of the first transistor and the second capacitor electrode of the second capacitor to each other based on the PWM emission signal.

7. The display device of claim 6, further comprising a scan control line and a gate-off voltage line connected to the first pixel driver,
   wherein the first pixel driver further comprises a ninth transistor to electrically connect the gate-off voltage line and the second capacitor electrode of the first capacitor to each other based on a scan control signal received from the scan control line.

8. The display device of claim 7, wherein the first pixel driver further comprises a tenth transistor to electrically connect the second capacitor electrode of the second capacitor and the initialization voltage line to each other based on the scan control signal.

9. The display device of claim 1, further comprising a scan initialization line and an initialization voltage line connected to the second pixel driver,
wherein the second pixel driver further comprises:
an eleventh transistor to electrically connect a second electrode of the third transistor and the gate electrode of the third transistor to each other based on the scan write signal; and
a twelfth transistor to electrically connect the gate electrode of the third transistor and the initialization voltage line to each other based on a scan initialization signal received from the scan initialization line.

10. The display device of claim 9, further comprising a tenth transistor comprising a plurality of transistors connected in series between the second electrode of the third transistor and the gate electrode of the third transistor.

11. The display device of claim 9, wherein the eleventh transistor comprises a plurality of transistors connected in series between the gate electrode of the third transistor and the initialization voltage line.

12. The display device of claim 9, further comprising a PWM emission line, a pulse amplitude modulation (PAM) emission line, and a second power supply line connected to the second pixel driver,
wherein the second pixel driver further comprises:
a thirteenth transistor to electrically connect the second power supply line and the first electrode of the third transistor to each other based on a PWM emission signal received from the PWM emission line; and
a fourteenth transistor to electrically connect the second electrode of the third transistor and a first electrode of the light-emitting element to each other based on a PAM emission signal received from the PAM emission line.

13. The display device of claim 12, wherein the second pixel driver further comprises a fifteenth transistor to electrically connect the first electrode of the light-emitting element and the initialization voltage line to each other based on the scan initialization signal.

14. A display device comprising:
a first pixel driver connected to a scan initialization line, a scan write line, a scan control line, a sweep line, an initialization voltage line, a gate-off voltage line, and a first data line, the first pixel driver being configured to generate a control current based on a first data voltage received from the first data line;
a second pixel driver connected to the scan write line and a second data line, the second pixel driver being configured to generate a driving current based on a second data voltage received from the second data line, and control a period during which the driving current flows, based on the control current; and
a light-emitting element connected to the second pixel driver to receive the driving current,
wherein the first pixel driver comprises:
a first transistor to generate the control current based on the first data voltage;
a second transistor to provide the first data voltage to a first electrode of the first transistor based on a scan write signal received from the scan write line;
a third transistor to electrically connect a gate electrode of the first transistor and the initialization voltage line to each other based on a scan initialization signal received from the scan initialization line;
a first capacitor including a first capacitor electrode connected to the gate electrode of the first transistor, and a second capacitor electrode connected to the sweep line; and
a fourth transistor to electrically connect the gate-off voltage line and the second capacitor electrode of the first capacitor to each other based on a scan control signal received from the scan control line,
wherein the scan initialization signal and the scan write signal are generated one time in one frame, and
wherein the scan control signal is generated as many times in the one frame as that of a number of emission periods in the one frame.

15. The display device of claim 14, wherein the second pixel driver comprises:
a fifth transistor to generate the driving current based on the control current; and
a sixth transistor to provide the second data voltage to a first electrode of the fifth transistor based on the scan write signal received from the scan write line.

16. The display device of claim 15, wherein the second pixel driver further comprises a second capacitor including a first capacitor electrode connected to a gate electrode of the fifth transistor, and a second capacitor electrode to receive the control current.

17. The display device of claim 14, wherein a sweep signal of the sweep line has a pulse that linearly decreases from a gate-off voltage to a gate-on voltage during each of the emission periods of the one frame.

18. A display device comprising:
a substrate;
an active layer comprising a first channel, a first source electrode, and a first drain electrode on the substrate;
a first capacitor electrode on the active layer, the first capacitor electrode overlapping with the first channel;
a second capacitor electrode on the first capacitor electrode, the second capacitor electrode overlapping with the first capacitor electrode;
a sweep line on the second capacitor electrode to provide a sweep signal;
a second source electrode connected to the first drain electrode;
a second channel adjacent to the second source electrode;
a second drain electrode adjacent to the second channel;
a connecting electrode at the same layer as that of the sweep line, and connected to the second drain electrode;
a third capacitor electrode at the same layer as that of the first capacitor electrode; and
a fourth capacitor electrode at the same layer as that of the second capacitor electrode, and connected to the connecting electrode.

19. The display device of claim 18, further comprising:
a third drain electrode connected to the first source electrode;
a third channel adjacent to the third drain electrode;
a third source electrode adjacent to the third channel; and
a first data line on the sweep line, and electrically connected to the third source electrode to provide a first data voltage.

20. The display device of claim 19, further comprising:
a fourth channel overlapping with the third capacitor electrode;

a fourth source electrode on one side of the fourth channel;
a fourth drain electrode on another side of the fourth channel;
a fifth drain electrode connected to the fourth source electrode;
a fifth channel adjacent to the fifth drain electrode;
a fifth source electrode adjacent to the fifth channel; and
a second data line at the same layer as that of the first data line, and electrically connected to the fifth source electrode to provide a second data voltage.

\* \* \* \* \*